(12) United States Patent
Kuboki et al.

(10) Patent No.: US 10,700,398 B2
(45) Date of Patent: Jun. 30, 2020

(54) COOLING MEMBER AND POWER STORAGE MODULE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Hideyuki Kuboki, Mie (JP); Hiroki Hirai, Mie (JP); Makoto Higashikozono, Mie (JP)

(73) Assignees: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-Shi, Osaka (JP)

( * ) Notice: Subject to any disclaimer, the term of this patent is extended or adjusted under 35 U.S.C. 154(b) by 76 days.

(21) Appl. No.: 15/556,317

(22) PCT Filed: Mar. 17, 2016

(86) PCT No.: PCT/JP2016/058450
§ 371 (c)(1),
(2) Date: Sep. 7, 2017

(87) PCT Pub. No.: WO2016/148225
PCT Pub. Date: Sep. 22, 2016

(65) Prior Publication Data
US 2018/0076494 A1 Mar. 15, 2018

(30) Foreign Application Priority Data

Mar. 19, 2015 (JP) .................................. 2015-055921
Dec. 15, 2015 (JP) .................................. 2015-244101

(51) Int. Cl.
*H01M 10/655* (2014.01)
*H01M 10/6569* (2014.01)
(Continued)

(52) U.S. Cl.
CPC ........ *H01M 10/6569* (2015.04); *F28D 15/02* (2013.01); *H01G 11/18* (2013.01);
(Continued)

(58) Field of Classification Search
None
See application file for complete search history.

(56) References Cited

U.S. PATENT DOCUMENTS 4,997,032 A * 3/1991 Danielson .......... G11B 33/1413
165/104.19
5,411,077 A * 5/1995 Tousignant ............. F28D 15/02
165/104.33
(Continued)

FOREIGN PATENT DOCUMENTS

JP H1123169 A 1/1999
JP 2003046045 A 2/2003
(Continued)

OTHER PUBLICATIONS

International Search Report for application PCT/JP2016/058450 dated Jun. 14, 2016; 7 pages.

*Primary Examiner* — Jeremiah R Smith
(74) *Attorney, Agent, or Firm* — Reising Ethington, P.C.

(57) ABSTRACT

A cooling member includes a fluid-tight sealed body that is formed by a first laminated sheet and a second laminated sheet being joined to each other at at least one joint portion, a coolant that is enclosed in the sealed body, and a heat dissipation plate that is joined in a fluid-tight manner to an inner surface of the sealed body at at least one joint portion and that has a heat absorption portion that is located inside
(Continued)

the sealed body and a heat dissipation portion that is located outside the sealed body.

9 Claims, 22 Drawing Sheets

(51) Int. Cl.
| | |
|---|---|
| H01M 10/647 | (2014.01) |
| H01M 10/6551 | (2014.01) |
| H01M 10/613 | (2014.01) |
| H01L 23/427 | (2006.01) |
| H01M 10/6557 | (2014.01) |
| H01M 10/617 | (2014.01) |
| F28D 15/02 | (2006.01) |
| H01M 10/6552 | (2014.01) |
| H01M 10/653 | (2014.01) |
| H01M 10/6555 | (2014.01) |
| H01M 10/6567 | (2014.01) |
| H01G 11/18 | (2013.01) |
| H01G 11/78 | (2013.01) |
| H01M 10/6554 | (2014.01) |
| H01M 10/6556 | (2014.01) |
| H01M 10/6553 | (2014.01) |

(52) U.S. Cl.
CPC .......... *H01G 11/78* (2013.01); *H01L 23/427* (2013.01); *H01M 10/613* (2015.04); *H01M 10/617* (2015.04); *H01M 10/647* (2015.04); *H01M 10/653* (2015.04); *H01M 10/6551* (2015.04); *H01M 10/6552* (2015.04); *H01M 10/6555* (2015.04); *H01M 10/6557* (2015.04); *H01M 10/6567* (2015.04); *H01M 10/6553* (2015.04); *H01M 10/6554* (2015.04); *H01M 10/6556* (2015.04)

(56) References Cited

U.S. PATENT DOCUMENTS

| | | | | |
|---|---|---|---|---|
| 5,560,423 | A * | 10/1996 | Larson | F28D 15/0241 |
| | | | | 165/104.26 |
| 6,263,959 | B1 * | 7/2001 | Ikeda | F28D 15/0233 |
| | | | | 165/104.26 |
| 6,269,866 | B1 * | 8/2001 | Yamamoto | F28D 15/0233 |
| | | | | 165/104.26 |
| 2007/0029070 | A1 | 2/2007 | Yamamoto | |
| 2007/0068657 | A1 | 3/2007 | Yamamoto | |
| 2010/0025009 | A1 * | 2/2010 | Klett | F28D 15/0241 |
| | | | | 165/46 |
| 2010/0220439 | A1 * | 9/2010 | Qin | G06F 1/203 |
| | | | | 361/679.47 |
| 2014/0371946 | A1 * | 12/2014 | Kwak | H01M 10/625 |
| | | | | 700/300 |
| 2015/0129177 | A1 * | 5/2015 | Pai | F28D 15/046 |
| | | | | 165/104.26 |
| 2015/0159958 | A1 * | 6/2015 | Kimura | F28F 3/12 |
| | | | | 62/4 |

FOREIGN PATENT DOCUMENTS

| | | |
|---|---|---|
| JP | 2004071178 A | 3/2004 |
| JP | 2004211932 A | 7/2004 |
| JP | 2007043013 A | 2/2007 |
| JP | 2007093032 A | 4/2007 |
| JP | 2011243358 A | 12/2011 |
| JP | 2012175084 A | 9/2012 |
| JP | 2014056690 A | 3/2014 |
| JP | 5534264 B2 | 6/2014 |
| JP | 2015041558 A | 3/2015 |

* cited by examiner

COOLING MEMBER AND POWER STORAGE MODULE

CROSS REFERENCE TO RELATED APPLICATIONS

This application claims the priority of Japanese patent applications JP2015-055921 filed on Mar. 19, 2015 and JP2015-244101 filed on Dec. 15, 2015, the entire contents both of which are incorporated herein.

TECHNICAL FIELD

The present invention relates to a cooling member and a power storage module including the cooling member.

BACKGROUND ART

Conventionally, a heat pipe disclosed in Patent Document 1 (JPH11-23169A) is known. This heat pipe has a configuration in which a heat transfer fluid is fluid-tightly enclosed in a pipe made of a metal material.

SUMMARY

According to the above-described configuration, in order to enclose the heat transfer fluid, the pipe is required to have certain strength. The reason for this is that, when the heat transfer fluid receives heat from a heat-generating body and evaporates, the volume of the heat transfer fluid increases, resulting in an increase in the pressure within the pipe. Enclosing the heat transfer fluid in the pipe in a fluid-tight manner and using a pipe having relatively high strength have increased manufacturing costs.

The present design was made based on circumstances such as those described above, and it is an object thereof to provide a cooling member that can be manufactured at a reduced cost and a power storage module using the cooling member.

The present design provides a cooling member including a fluid-tight sealed body that is formed by sheet members being joined to each other at at least one joint portion; a coolant that is enclosed in the sealed body; and a heat dissipation plate that is fluid-tightly joined to an inner surface of the sealed body at at least one portion where the sheet members are joined together and that has a heat absorption portion that is located inside the sealed body and a heat dissipation portion that is located outside the sealed body.

According to the present design, when the coolant evaporates, the sheet members deform, thereby increasing the internal volume of the sealed body. Thus, the pressure within the sealed body decreases. As a result, compared with a case in which the cooling member is formed with a metal container having an unchangeable internal volume, the internal pressure resistance of the sealed body can be reduced. Consequently, the manufacturing cost of the cooling member can be reduced.

The following embodiments are preferred as embodiments of the present design.

It is preferable that the sheet members include a metal sheet.

With this configuration, since metal sheets have high thermal conductivity, the heat inside the sealed body can be quickly transferred to the outside of the sealed body, and then the heat can be dissipated into an external space.

It is preferable that the sheet members are each a laminated film in which a synthetic resin film is laminated on a surface of the metal sheet.

According to this embodiment, the sealed body can be formed by using a simple method of thermally fusion-bonding the laminated films.

It is preferable that an expansion portion is formed at a side edge of the sealed body by a side edge of the sheet member being bent toward the inside of the sealed body, the expansion portion being configured to expand so as to increase an internal volume of the sealed body when the coolant evaporates.

With this configuration, when the coolant evaporates, and the pressure within the sealed body thus increases, the expansion portion deforms and expands, so that the pressure within the sealed body can be further reduced. Consequently, the manufacturing cost of the cooling member can be further reduced.

It is preferable that an absorption sheet that absorbs the coolant is disposed in the sealed body.

With this configuration, the coolant is absorbed and held in the absorption sheet, and thus, the coolant can be uniformly disposed in a region where the absorption sheet is disposed. Consequently, unevenness in the cooling efficiency of the cooling member can be suppressed.

It is preferable that a plate-shaped separator is disposed in the sealed body, and grooves are formed in the separator, the grooves extending in a direction in which the grooves approach that joint portion, of the at least one joint portion, that is joined to the heat dissipation plate.

Also, it is preferable that grooves are formed in the heat absorption portion of the heat dissipation plate, the grooves extending in a direction in which the grooves approach that joint portion, of the at least one joint portion, that is joined to the heat dissipation plate.

With these configurations, the coolant that has evaporated flows through the grooves that are formed in the separator or the heat dissipation plate, thereby coming near the joint portion connected to the heat dissipation plate. The vapor of the coolant near the joint portion that is joined to the heat dissipation plate comes into contact with the heat absorption portion of the heat dissipation plate and transfers heat to the heat dissipation plate. The heat that has been transferred to the heat dissipation plate is quickly conducted from the heat absorption portion to the heat dissipation portion and then dissipated from the heat dissipation portion to the outside of the cooling member. In this manner, with the present configurations, since the coolant that has evaporated flows through the grooves and then transfers the heat to the heat dissipation plate in the vicinity of the joint portion that is joined to the heat dissipation plate, the heat can be quickly conducted to the heat dissipation portion, and the heat can then be quickly dissipated to the outside of the cooling member.

Moreover, a power storage module according to the present design includes the cooling member; a housing in which the cooling member is accommodated; and a power storage element that is accommodated in the housing, at least a portion of an outer surface of the power storage element being in contact with the cooling member.

With this configuration, heat that has been generated by the power storage element is absorbed by the cooling member that is in contact with a portion of the outer surface of the power storage element. Since the cooling member is formed to be fluid-tight, and the coolant is enclosed in the cooling member that is formed to be fluid-tight, there is no necessity to configure the housing of the power storage module so as to be fluid-tight. As a result, the manufacturing cost of the power storage element can be reduced.

Also, it is preferable that, in the power storage module, a slit is formed in the housing, and the heat dissipation portion is inserted through the slit and exposed to the outside of the housing.

With this configuration, heat can be efficiently dissipated from the heat dissipation portion, which is exposed to the outside of the housing, so that the heat dissipation properties of the power storage element can be improved.

According to the present design, manufacturing costs of a cooling member or a power storage element can be reduced.

DESCRIPTION OF EMBODIMENTS

Embodiment 1

Figure 1:
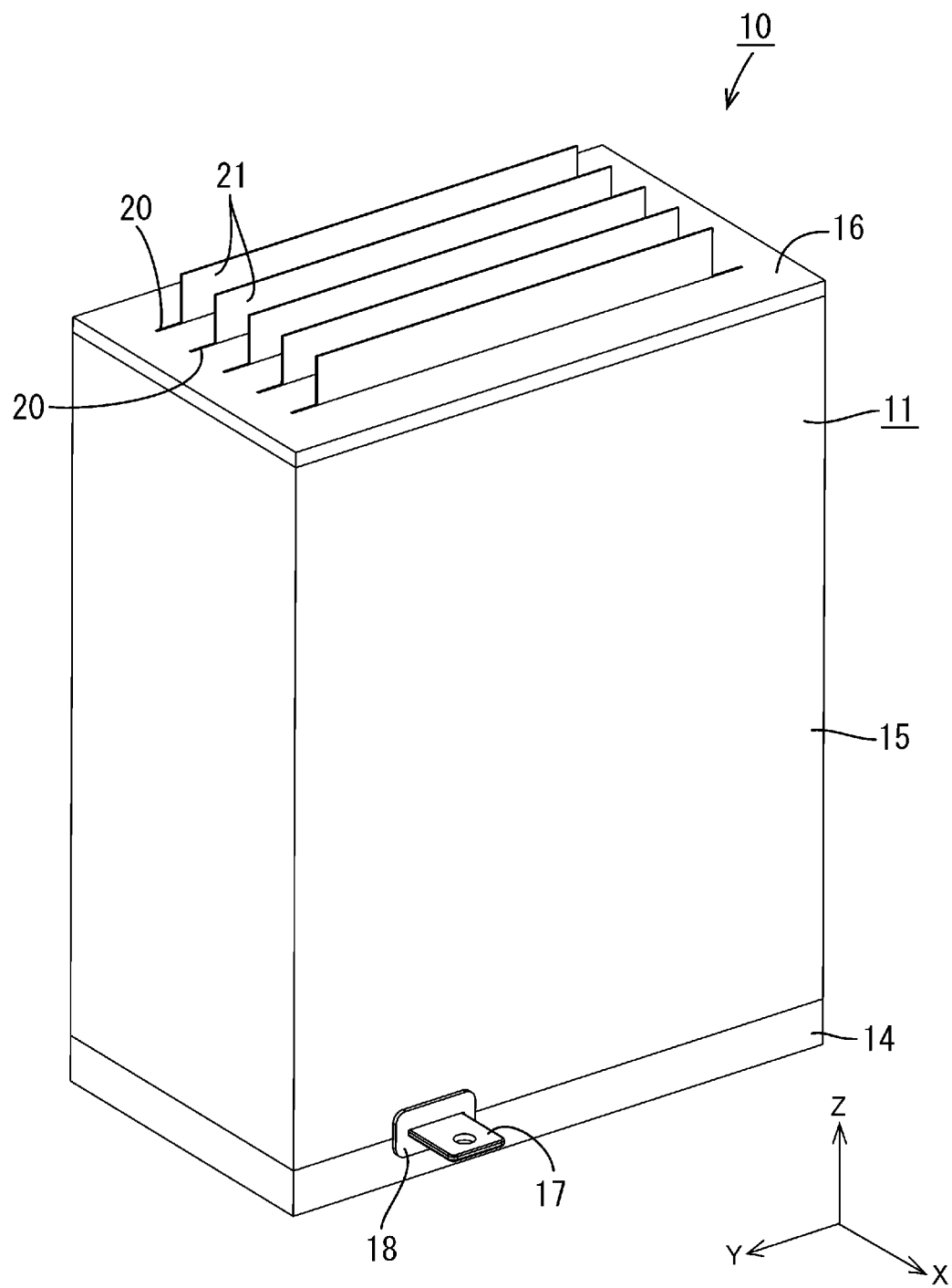
FIG. 1 is a perspective view showing a power storage module according to Embodiment 1.

Embodiment 1 will be described with reference to FIGS. 1 to 14. A power storage module 10 according to the present embodiment includes a housing 11, power storage elements 12 that are accommodated in the housing 11, and cooling members 13 that are accommodated in the housing 11 and that are in contact with a portion of an outer surface of the power storage elements 12. In the following description, a direction X is taken as the right side, a direction Y as the front side, and a direction Z as the upper side. Also, with respect to a plurality of members having the same shape, at least one of those members may be denoted by a reference numeral, and the reference numeral may be omitted from the other members.

Figure 2:
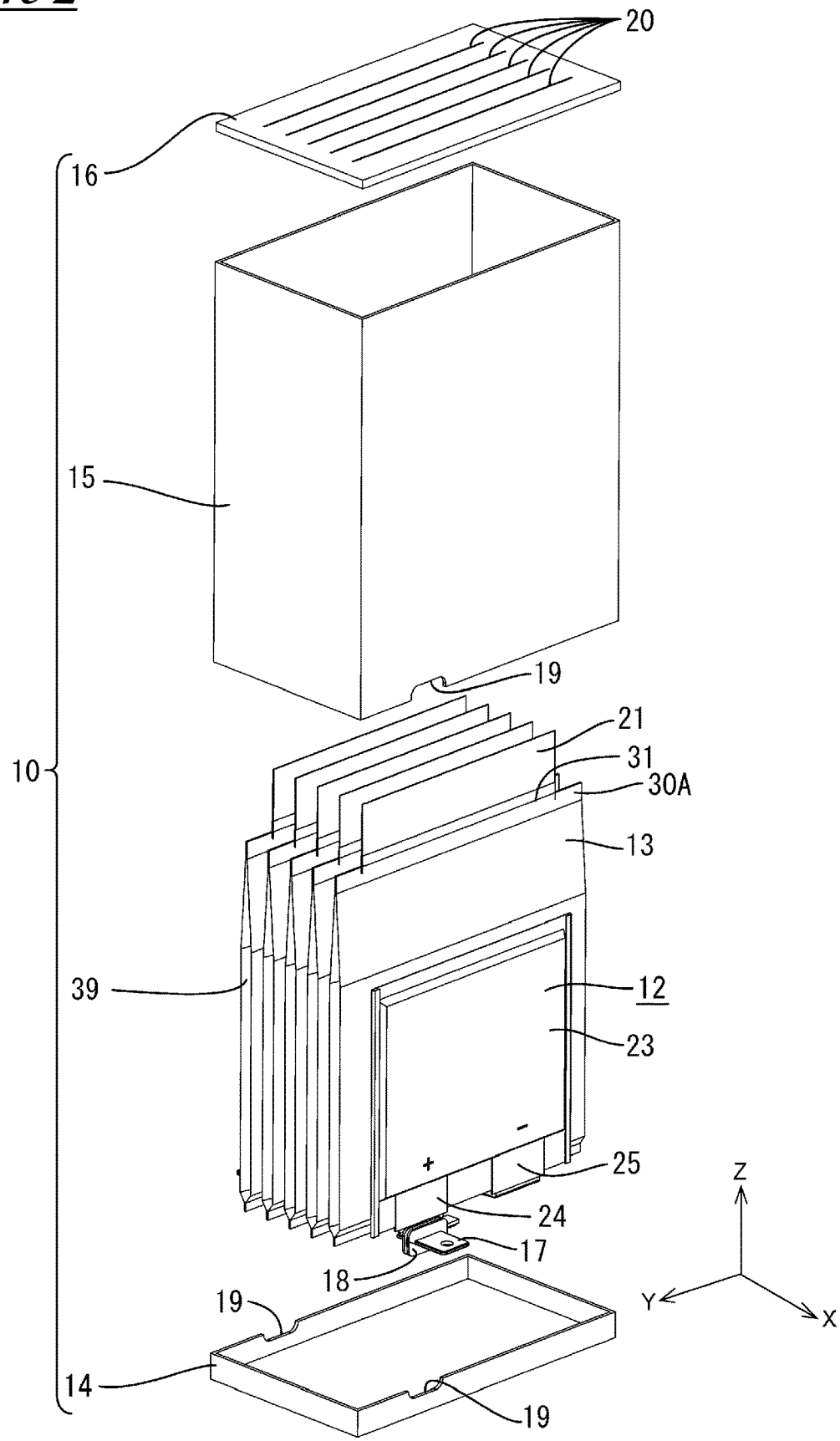
FIG. 2 is an exploded perspective view showing the power storage module.

As shown in FIG. 1, the housing 11 has a substantially rectangular parallelepiped shape as a whole. As shown in FIG. 2, the housing 11 includes a lower case 14 that is open upward and that has a substantially rectangular shape when viewed from above, a rectangular tube-shaped middle case 15 that is attached to an upper portion of the lower case 14 and that has a substantially rectangular cross-sectional shape, and an upper case 16 that is attached to an upper end portion of the middle case 15 to cover an upper side of the middle case 15 and that has a substantially rectangular plate-like shape. A lower end edge of the middle case 15 has a shape that conforms to the shape of an upper end edge of the lower case 14, and an upper end edge of the middle case 15 has a shape that conforms to side edges of the upper case 16.

The lower case 14, the middle case 15, and the upper case 16 can each be formed of any material, such as a synthetic resin, a metal, or the like. The lower case 14, the middle case 15, and the upper case 16 may be formed of different materials, or a configuration may also be adopted in which these cases are formed of the same material.

The lower case 14 and the middle case 15 can be attached to each other by using a known method, such as an engagement structure for engagement between a locking member and a locked member, a screwing structure, or adhesion via an adhesive material. Similarly, the middle case 15 and the upper case 16 can be attached to each other by using a known method, such as an engagement structure for engagement between a locking member and a locked member, a screwing structure, or adhesion via an adhesive material. Moreover, in the case where the lower case 14, the middle case 15, and the upper case 16 are formed of a metal, these cases can be joined to each other by using a known method, such as laser welding or brazing. In the present embodiment, the lower case 14, the middle case 15, and the upper case 16 are non-fluid-tightly attached to each other. It should be noted that the lower case 14, the middle case 15, and the upper case 16 may also be fluid-tightly attached to each other.

Figure 3:
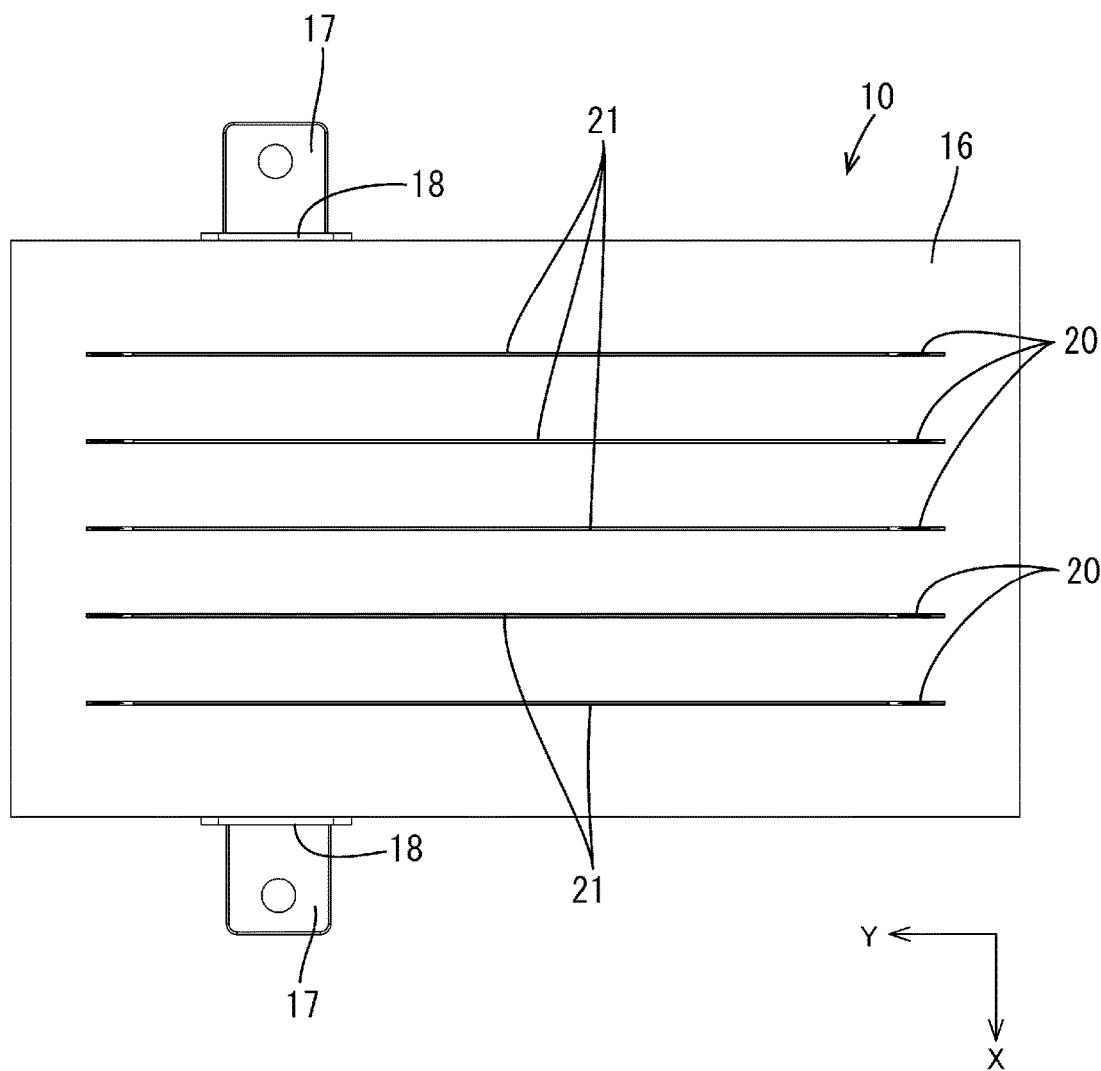
FIG. 3 is a plan view showing the power storage module.
Figure 4:
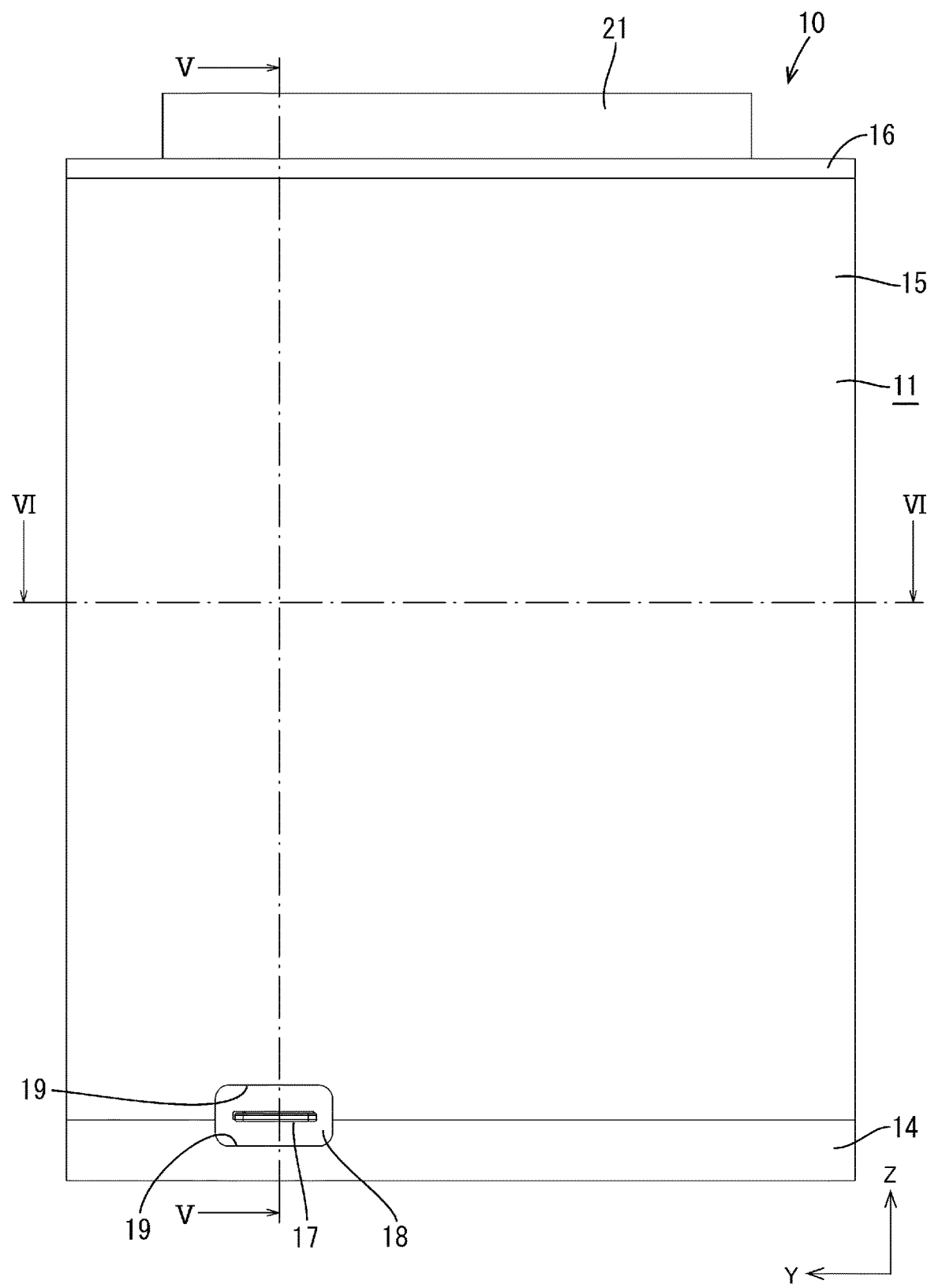
FIG. 4 is a side view showing the power storage module.
Figure 5:
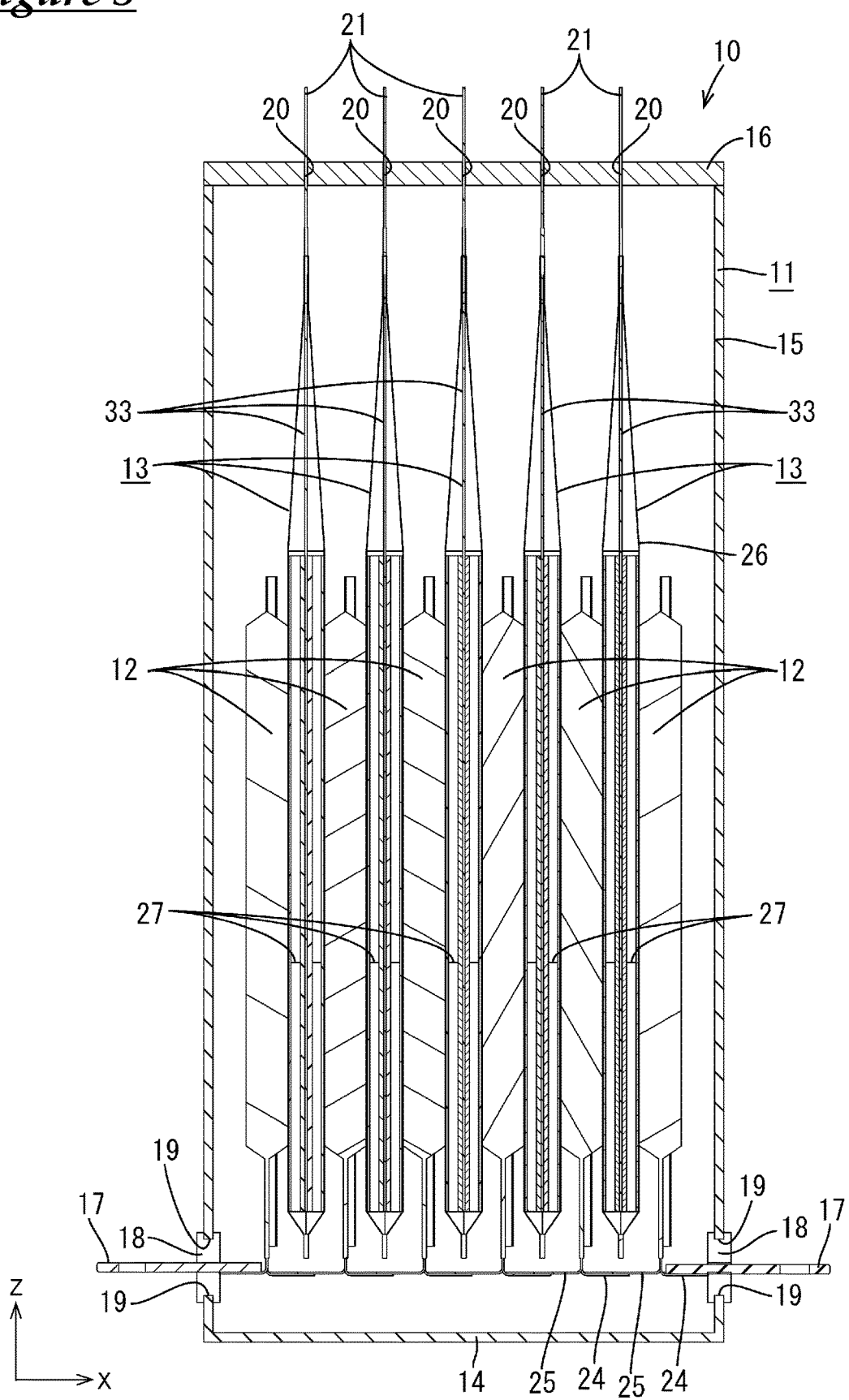
FIG. 5 is a cross-sectional view taken along line V-V in FIG. 4.

As shown in FIG. 3, a pair of power terminals 17 are disposed at positions that are located near a lower end portion of the housing 11 and near a front end portion of the housing 11, the power terminals 17 protruding leftward and rightward, respectively. As shown in FIGS. 4 and 5, the power terminals 17 are formed of a metal plate material. The power terminals 17 are each attached to the housing 11 via a grommet 18 formed of an insulating material. Fitting recesses 19 to which the grommets 18 are fitted are formed at the upper end edge of the lower case 14 and the lower end edge of the middle case 15.

As shown in FIG. 3, a plurality of (five in the present embodiment) slits 20 extending in the front-rear direction are provided in an upper surface of the upper case 16, the slits 20 being in communication with the inside and outside of the housing 11. The slits 20 are configured to allow respective heat dissipation portions 21, which will be described later, to be inserted therethrough.

Figure 6:
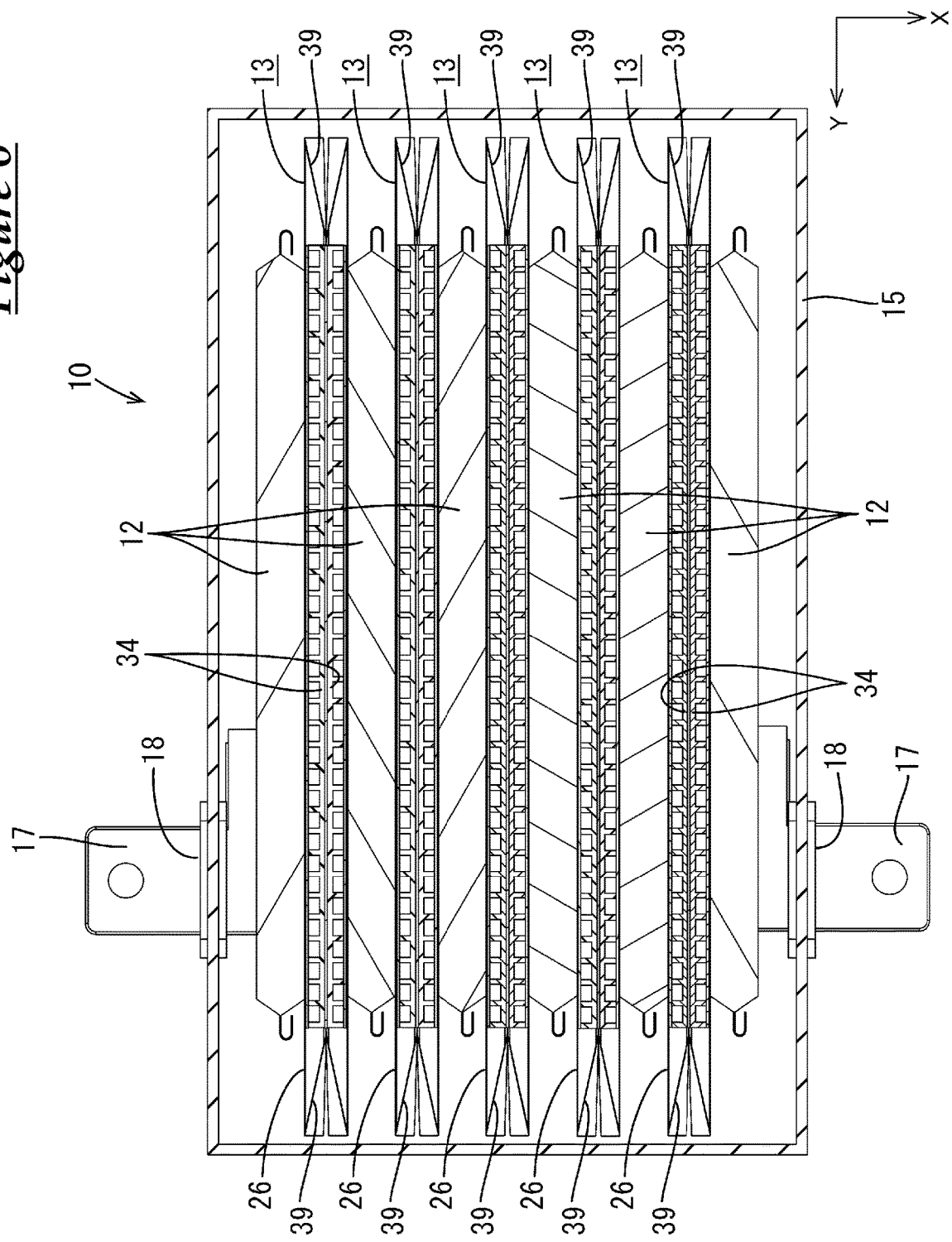
FIG. 6 is a cross-sectional view taken along line VI-VI in FIG. 4.

As shown in FIGS. 5 and 6, each power storage element 12 is formed by sandwiching a power storage component, which is not shown, between a pair of laminated battery sheets 23 and fluid-tightly joining the laminated battery sheets 23 to each other at their side edges by using a known method, such as thermal fusion-bonding. As shown in FIG.

9, a positive electrode terminal 24 and a negative electrode terminal 25 in the form of metal foils protrude from a lower end edge of the power storage element 12, the positive and negative electrode terminals 24 and 25 extending from the inside to the outside of the laminated battery sheets 23 while being in a fluid-tight state with inner surfaces of the laminated battery sheets 23. The positive electrode terminal 24 and the negative electrode terminal 25 are arranged side-by-side while being spaced apart from each other in the front-rear direction. The positive electrode terminal 24 and the negative electrode terminal 25 are each electrically connected to the power storage component.

Figure 7:
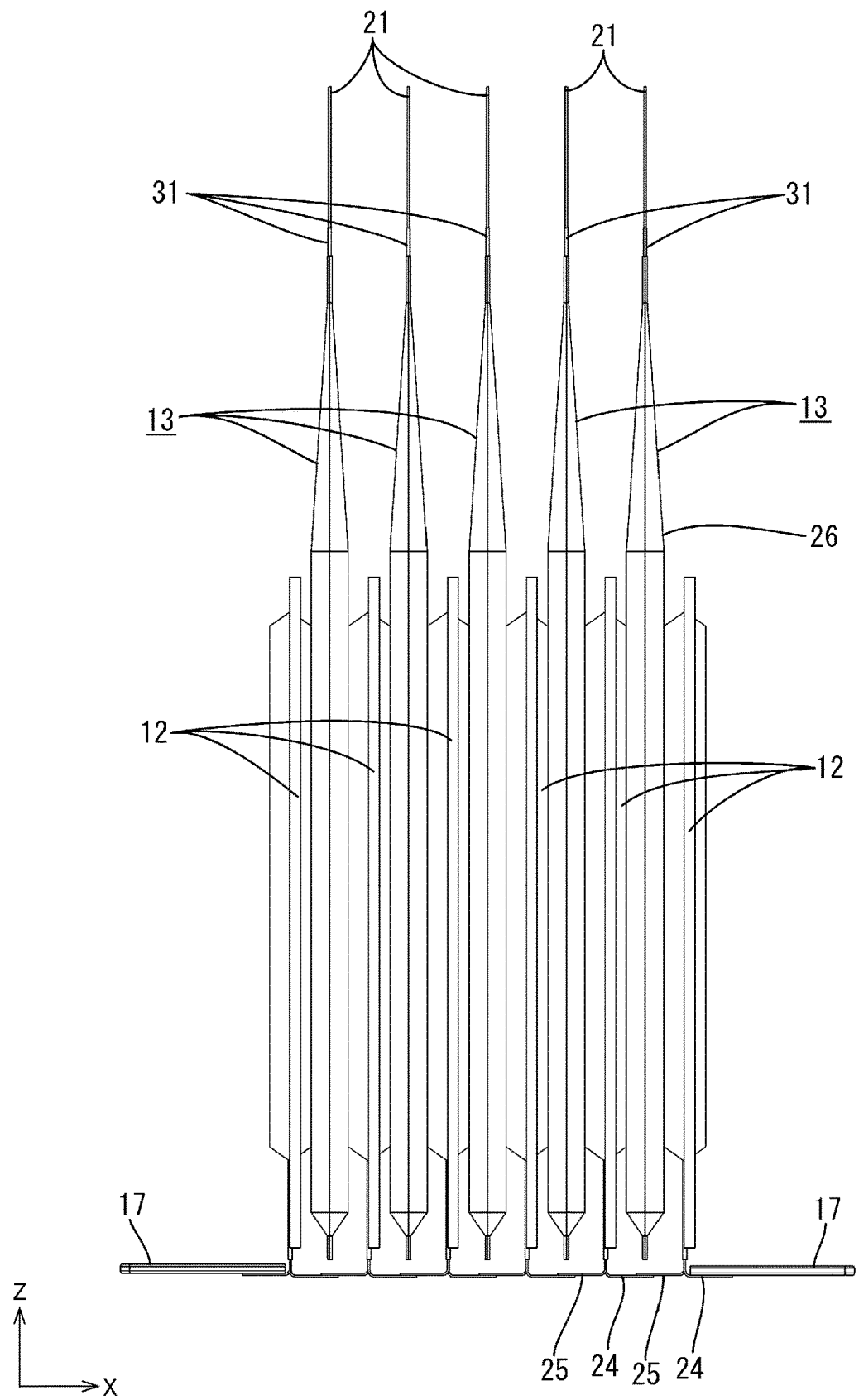
FIG. 7 is a front view showing a state in which power storage elements and cooling members are lined up.
Figure 8:
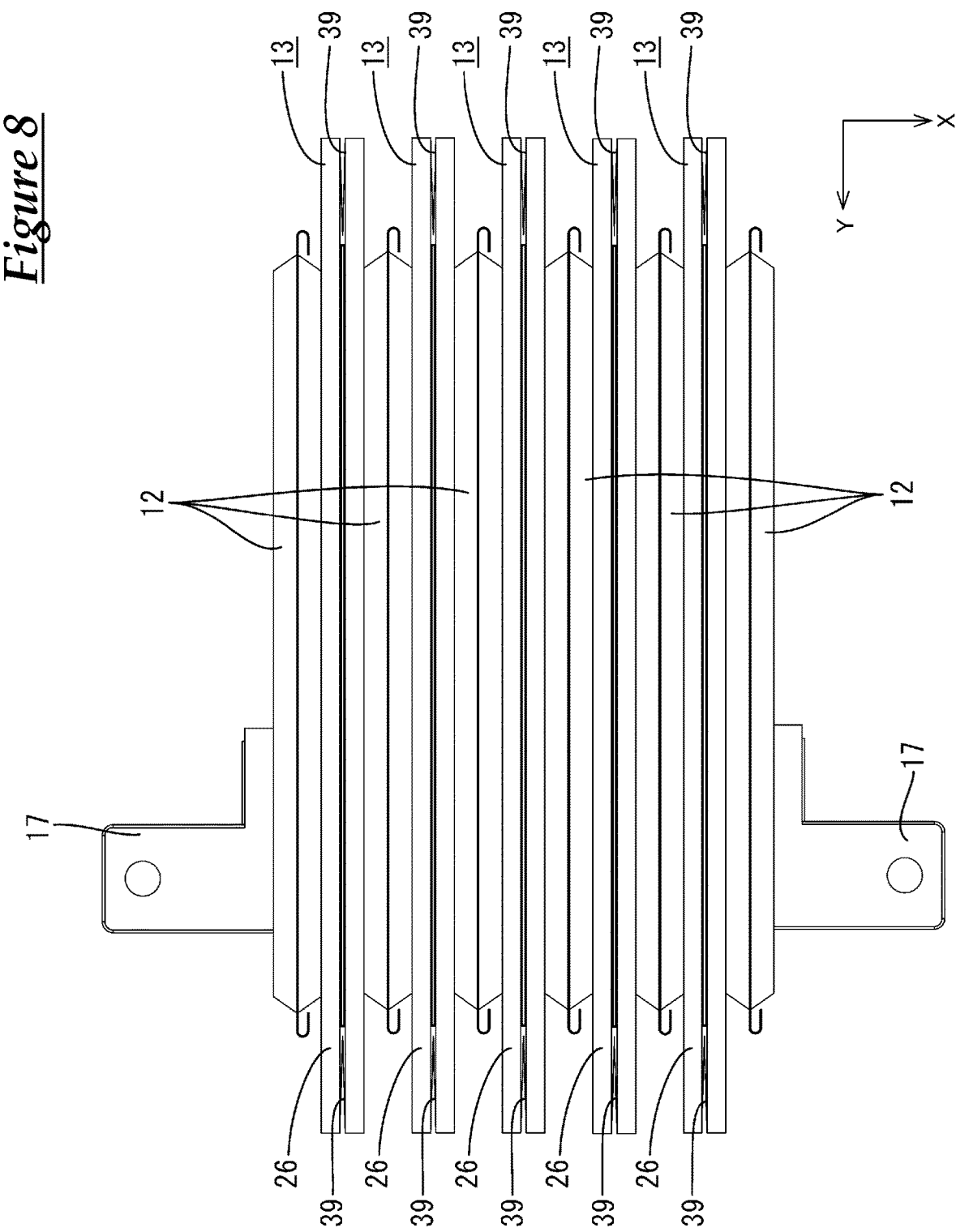
FIG. 8 is a plan view showing the state in which the power storage elements and the cooling members are lined up.
Figure 9:
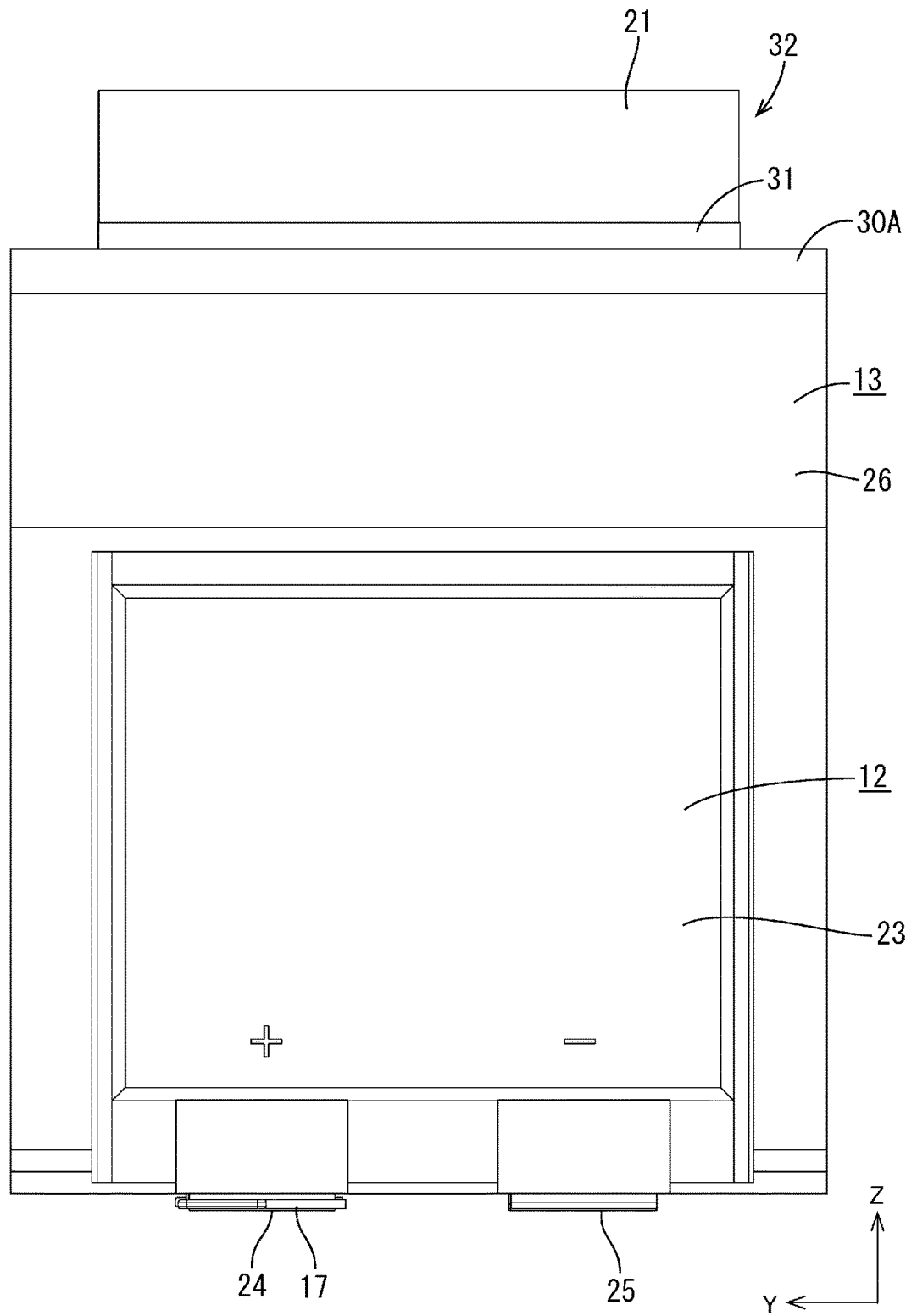
FIG. 9 is a side view showing the state in which the power storage elements and the cooling members are lined up.

As shown in FIGS. 7 and 8, a plurality of (six in the present embodiment) power storage elements 12 are lined up in the left-right direction. The power storage elements 12 that are adjacent to each other in the left-right direction are arranged in such a manner that the positive electrode terminal 24 of one power storage element 12 is located adjacent to the negative electrode terminal 25 of another power storage element 12, and the negative electrode terminal 25 of the one power storage element 12 is located adjacent to the positive electrode terminal 24 of the other power storage element 12. A positive electrode terminal 24 and a negative electrode terminal 25 that are adjacent to each other are bent toward each other, and in a state in which the positive electrode terminal 24 and the negative electrode terminal 25 overlap each other in the up-down direction, the two electrode terminals are electrically connected to each other by using a known method, such as laser welding, ultrasonic welding, or brazing. Thus, the plurality of power storage elements 12 are connected together in series.

In the present embodiment, for example, secondary batteries such as lithium-ion secondary batteries or nickel-metal hydride secondary batteries may be used as the power storage elements 12. Alternatively, capacitors such as electric double layer capacitors or lithium-ion capacitors may also be used as the power storage elements 12. Thus, any power storage elements 12 can be appropriately selected as the power storage elements 12, as necessary.

Figure 10:
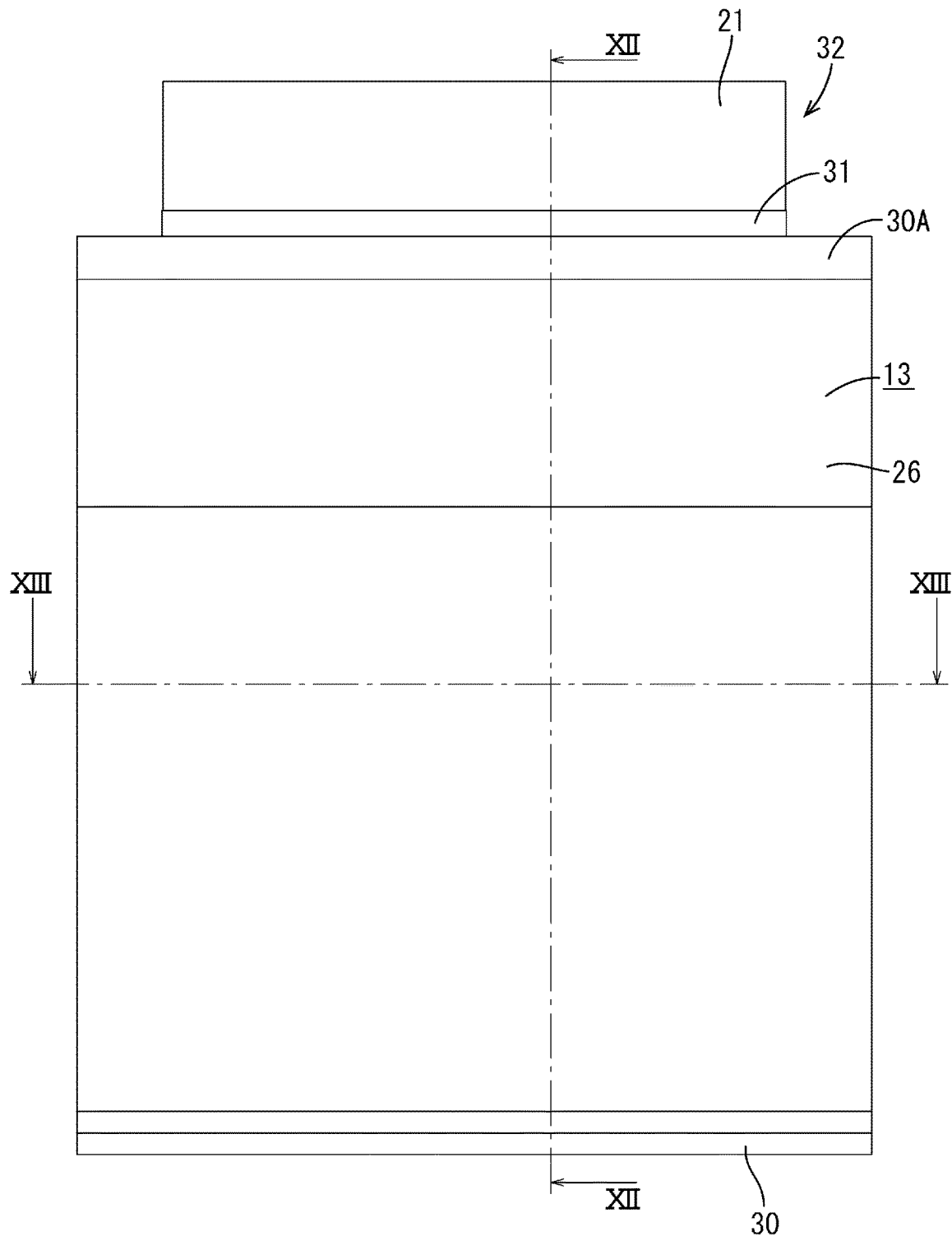
FIG. 10 is a side view showing a cooling member.

As shown in FIG. 10, each cooling member 13 is formed by enclosing a coolant 27 in a sealed body 26 that is formed to be fluid-tight. The amount of coolant 27 that is enclosed in the sealed body 26 can be appropriately selected, as necessary. For example, perfluorocarbon, hydrofluoroether, hydrofluoroketone, a fluorine inert liquid, or the like can be used as the coolant 27. The coolant 27 may have insulating properties or may have conductivity. The height dimension of the cooling member 13 in the up-down direction is set to be larger than the height dimension of the power storage elements 12 in the up-down direction.

Figure 11:
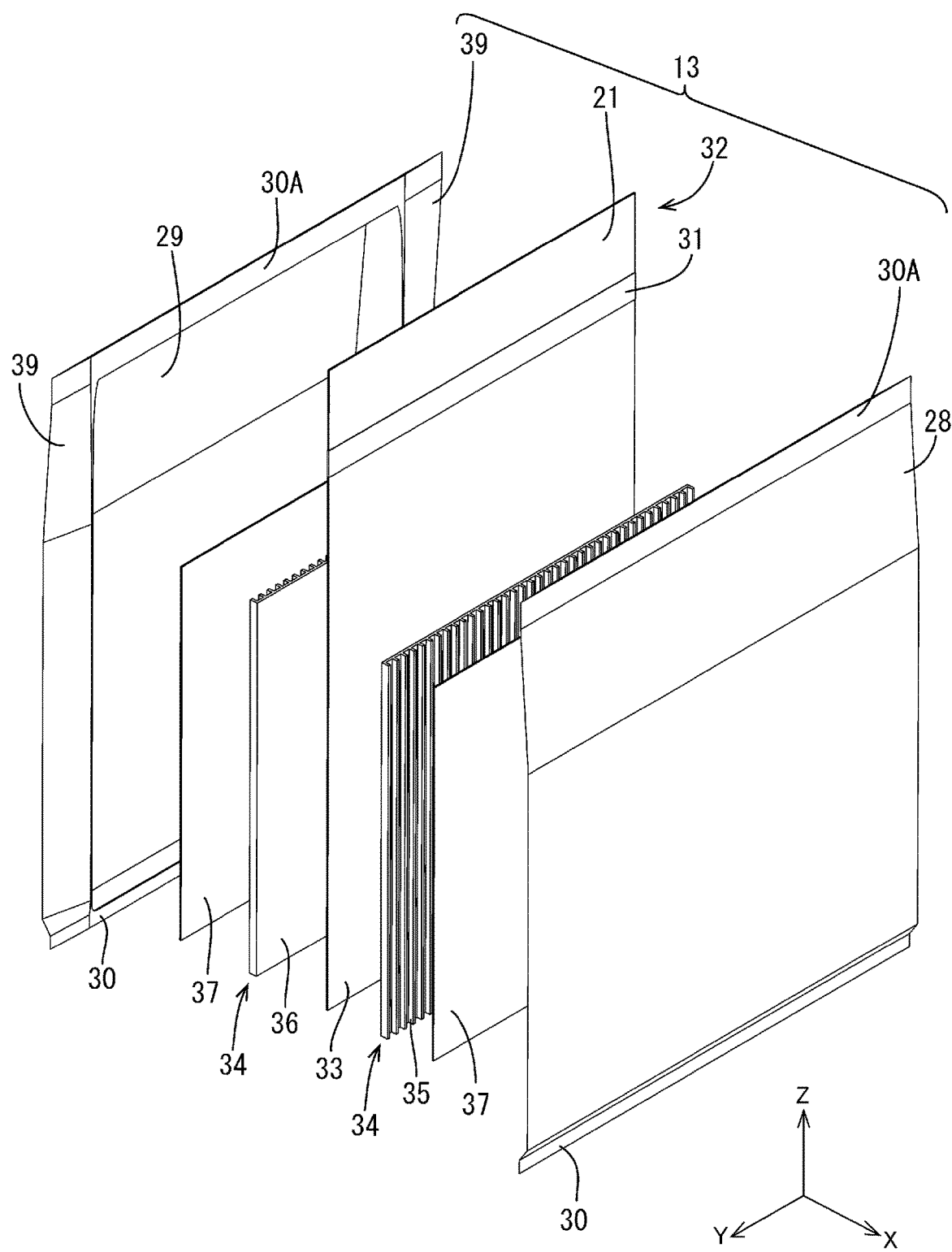
FIG. 11 is an exploded side view showing the cooling member.

As shown in FIG. 11, the sealed body 26 is constituted by a first laminated sheet 28 (an example of a sheet member) that has a substantially rectangular shape and a second laminated sheet 29 (an example of a sheet member) that has a substantially rectangular shape and that has expansion portions 39 slightly extending forward and rearward, respectively, beyond the first laminated sheet 28, and is formed by the first and second laminated sheets 28 and 29 being joined to each other at a joint portion 30 by using a known method such as adhesion or welding.

The first laminated sheet 28 and the second laminated sheet 29 are each formed by laminating synthetic resin films on both surfaces of a metal sheet. With regard to the metal composing the metal sheet, any metal, such as aluminum, an aluminum alloy, copper, or a copper alloy, can be appropriately selected, as necessary. With regard to the synthetic resin composing the synthetic resin films, any synthetic resin, such as polyolefin such as polyethylene or polypropylene, polyester such as polybutylene terephthalate or polyethylene terephthalate, or polyamide such as nylon 6 or nylon 6,6, can be appropriately selected, as necessary.

A heat dissipation plate 32 made of a metal is fluid-tightly joined to an inner surface of the first laminated sheet 28 and an inner surface of the second laminated sheet 29 via a sealing material 31 at a joint portion 30A that is formed at an upper end edge of the sealed body 26. In the drawings, a configuration is shown in which the sealing material 31 is applied to the heat dissipation plate 32 side; however, a configuration may also be adopted in which the sealing material 31 is applied to the inner surface of the first laminated sheet 28 and the inner surface of the second laminated sheet 29.

The heat dissipation plate 32 is formed of a metal material such as aluminum, an aluminum alloy, copper, a copper alloy, or stainless steel. The heat dissipation plate 32 includes a heat absorption portion 33 that is located inside the sealed body 26 and a heat dissipation portion 21 that is located outside the sealed body 26. The heat dissipation portion 21 protrudes upward from the joint portion 30A where the heat dissipation plate 32 is fluid-tightly joined to the first laminated sheet 28 and the second laminated sheet 29. Both of the front and rear side edges as well as a lower edge of the heat dissipation plate 32 are located inside the sealed body 26 and are not sandwiched between the first laminated sheet 28 and the second laminated sheet 29.

Figure 12:
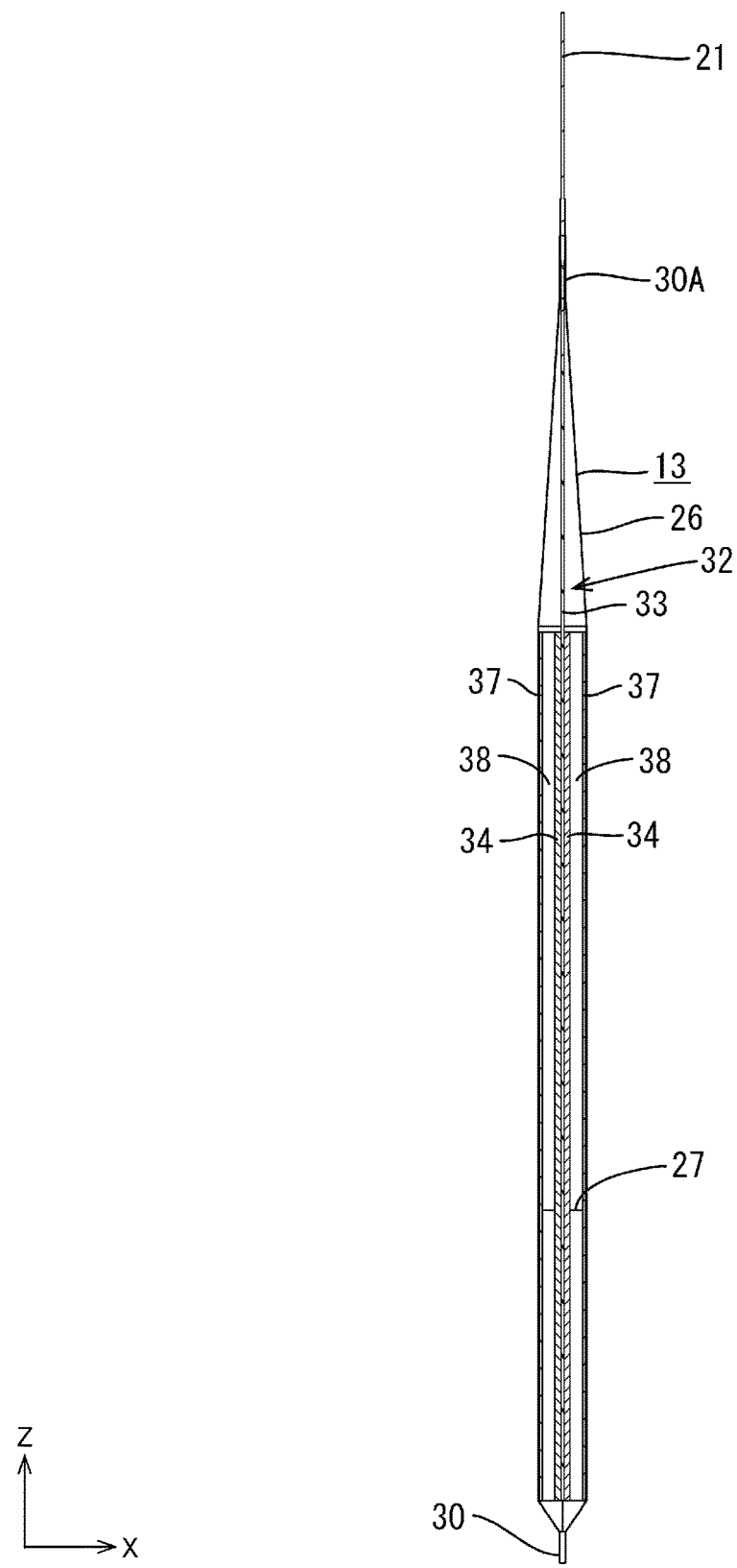
FIG. 12 is a cross-sectional view taken along line XII-XII in FIG. 10.
Figure 13:
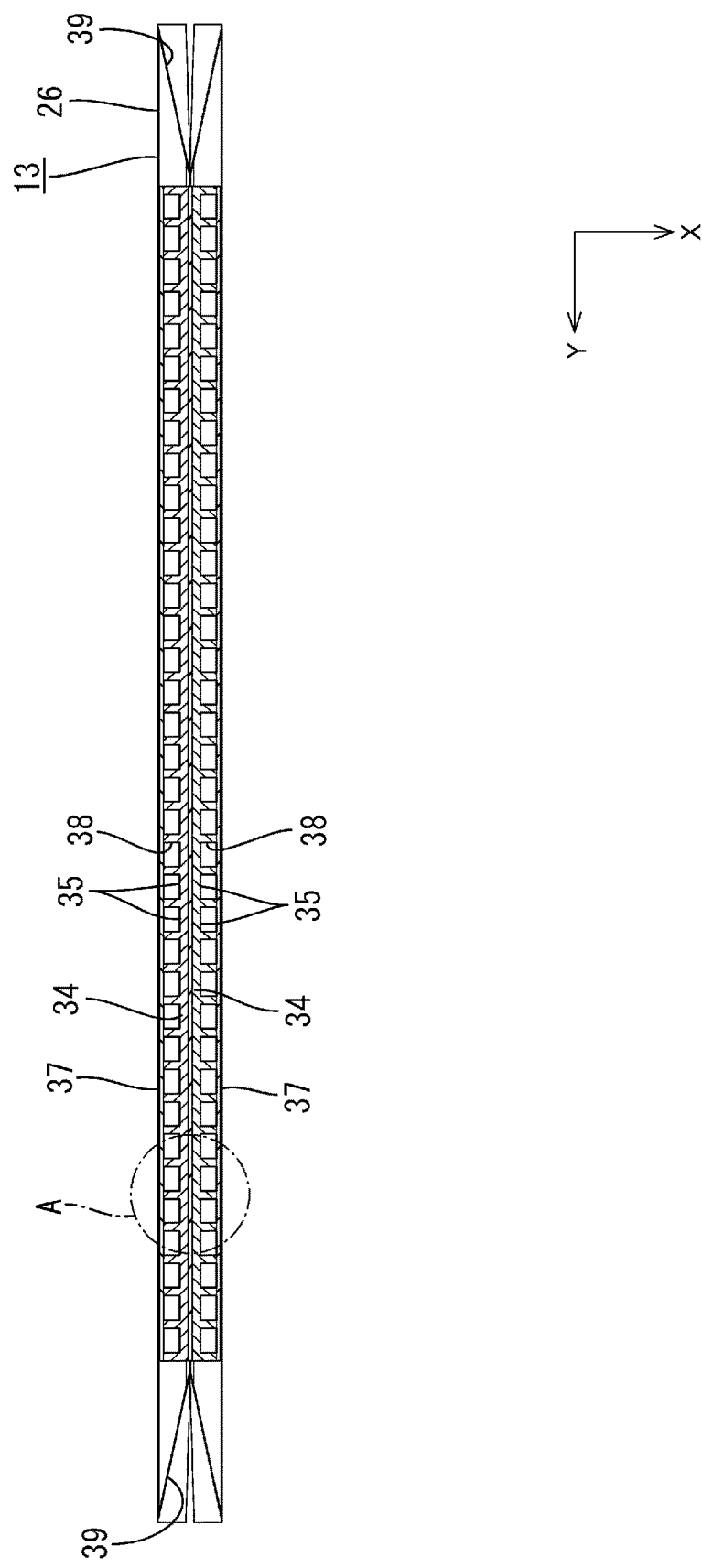
FIG. 13 is a cross-sectional view taken along line XIII-XIII in FIG. 10.

As shown in FIGS. 11 to 13, a pair of separators 34 sandwiching the heat absorption portion 33 of the heat dissipation plate 32 from opposite sides with respect to the left-right direction are accommodated in the sealed body 26. The separators 34 can be formed of any material, such as a metal such as aluminum, an aluminum alloy, a copper, a copper alloy, or stainless steel or a synthetic resin such as polybutylene terephthalate, polypropylene, or polyethylene, as necessary.

The separators 34 are each substantially rectangular plate-shaped. A plurality of grooves 35 extending in the up-down direction are formed in one surface of each separator 34, the grooves 35 being arranged side-by-side in the front-rear direction. As shown in FIGS. 11 to 13, the plurality of grooves 35 extend from a lower end edge to an upper end edge of each separator 34. A surface of each separator 34 that is on the opposite side to the surface in which the grooves 35 are formed constitutes a flat surface 36. The pair of separators 34 are disposed in the sealed body 26 with their flat surfaces 36 facing the heat dissipation plate 32 side. In other words, the heat dissipation plate 32 is in contact with the flat surfaces 36 of the separators 34 (see FIG. 14).

Figure 14:
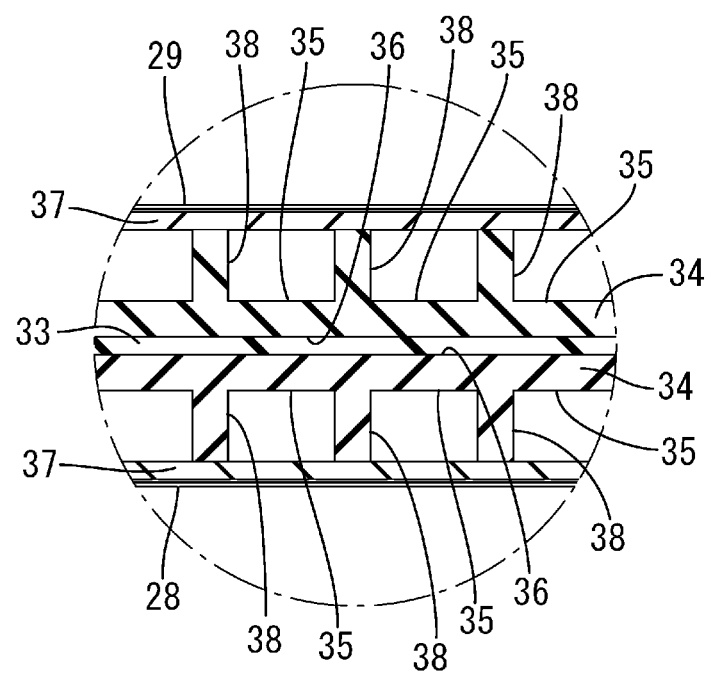
FIG. 14 is an enlarged view of a region A in FIG. 13.
Figure 15:
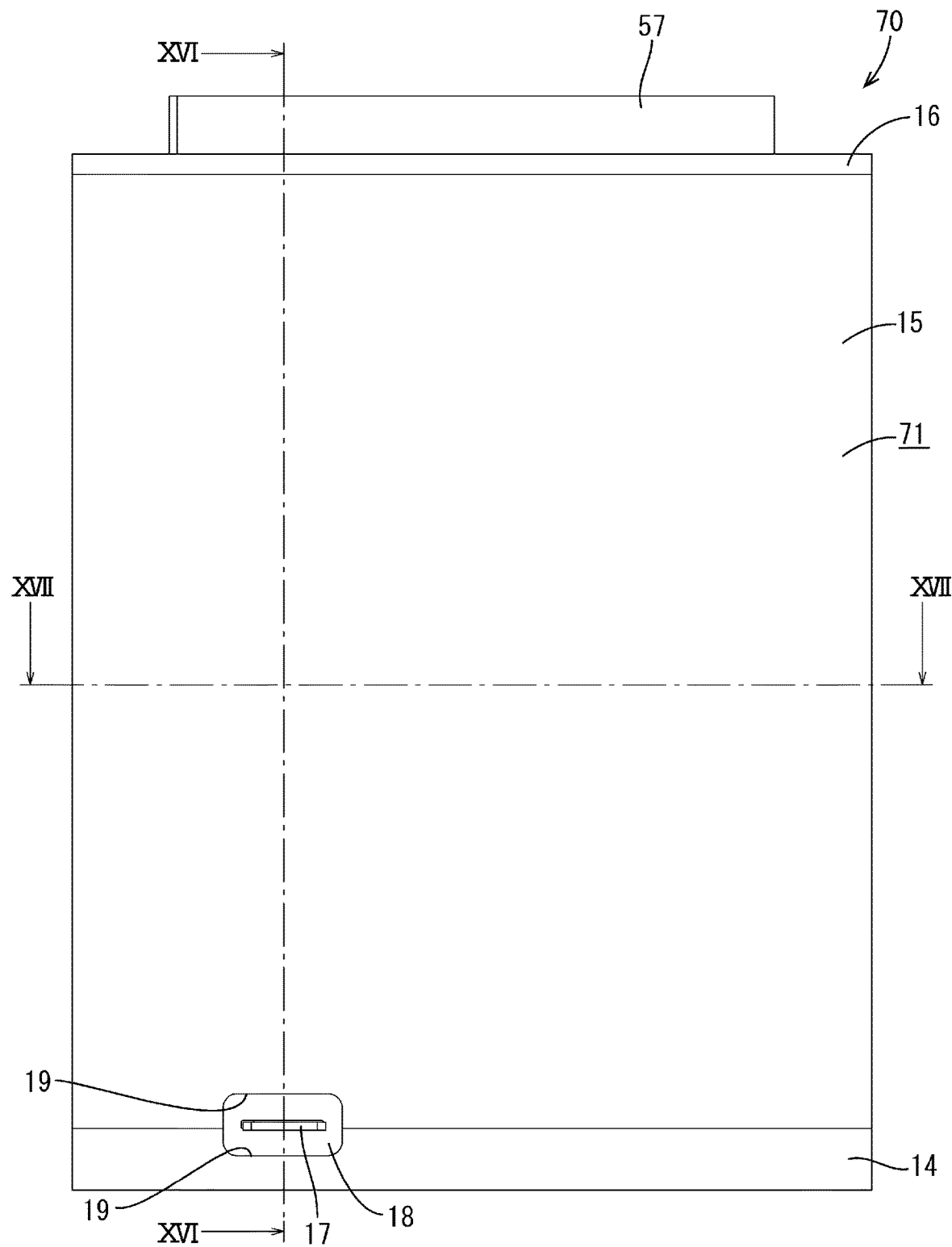
FIG. 15 is a side view showing a power storage module according to Embodiment 2.

As shown in FIG. 11, a pair of absorption sheets 37 are further housed in the sealed body 26. The absorption sheets 37 each have a substantially rectangular shape and are formed to have substantially the same size as the separators 34. The pair of absorption sheets 37 are arranged so as to sandwich the separators 34 from the outer sides of the respective separators 34 with respect to the left-right direction. As shown in FIG. 14, spaces that are formed by inner walls of the grooves 35 formed in the separators 34 with the absorption sheets 37 serve as air flow paths 38 through which a vapor of the coolant 27 that has evaporated and gasified flows upward.

As shown in FIG. 12, in a state in which the separators 34 are accommodated in the sealed body 26, the plurality of grooves 35 extend in a direction in which they approach that joint portion 30, of the joint portions 30 of the first laminated sheet 28 and the second laminated sheet 29, to which the heat dissipation plate 32 is fluid-tightly joined. In other words, if the cooling member 13 is disposed in such an orientation that, in FIG. 12, the joint portion 30 to which the heat dissipation plate 32 is fluid-tightly joined is located on the upper side, the separators 34 are disposed in the sealed body 26 in such an orientation that the plate surfaces of the separators 34 extend along the up-down direction. In addition, the grooves 35 that are formed in the separators 34 extend along the up-down direction.

In the present embodiment, the plurality of grooves 35 extend parallel to one another along the up-down direction. It should be noted that the plurality of grooves 35 are not necessarily required to be provided parallel to one another. Moreover, the grooves 35 may be formed into a straight line shape, but may also be formed into a curved shape.

The absorption sheets 37 are formed of a material that is capable of absorbing the coolant 27. The absorption sheets 37 may be woven fabrics obtained from the material capable of absorbing the coolant 27 that has been processed into fiber form, but may also be nonwoven fabrics obtained from that material. With respect to the forms of nonwoven fabric, the absorption sheets 37 may be fiber sheets, webs (thin film-like sheets composed only of fibers), or batts (fibers in felt form). The material constituting the absorption sheets 37 may be a natural fiber, a synthetic fiber made of a synthetic resin, or a material using both the natural fiber and the synthetic fiber.

As shown in FIG. 13, in a state in which the first laminated sheet 28 and the second laminated sheet 29 are joined to each other, the expansion portions 39, which are provided at both of the front and rear end portions of the second laminated sheet 29, are folded (bent) toward the inside of the sealed body 26. The expansion portions 39 are configured to deform and expand in the left-right direction when the pressure within the sealed body 26 increases as a result of the coolant 27 evaporating and gasifying. Thus, the internal volume of the sealed body 26 increases, and accordingly, the internal pressure of the sealed body 26 decreases. As a result, the physical strength that is required of the sealed body 26 can be reduced.

In particular, the internal volume of the sealed body 26 is increased by the expansion portions 39 in a portion of the cooling member 13 that is located above the power storage elements 12 deforming and expanding in the left-right direction.

Effects of the Embodiment

Subsequently, the effects of the present embodiment will be described. Each cooling member 13 according to the present embodiment includes the fluid-tight sealed body 26 that is formed by joining the first laminated sheet 28 and the second laminated sheet 29 to each other at the at least one joint portion 30, the coolant 27 enclosed in the sealed body 26, and the heat dissipation plate 32 that is fluid-tightly joined to an inner surface of the sealed body 26 at at least one joint portion 30A of the joint portions 30 and that has the heat absorption portion 33 that is located inside the sealed body 26 and the heat dissipation portion 21 that is located outside the sealed body 26.

According to the present embodiment, when the coolant 27 evaporates and gasifies, the pressure within the sealed body 26 increases. This causes the first laminated sheet 28 and the second laminated sheet 29 to deform, and accordingly, the internal volume of the sealed body 26 increases. Thus, the pressure within the sealed body 26 decreases. As a result, compared with a case where the cooling member 13 is formed with a metal container having an unchangeable internal volume, the internal pressure resistance of the sealed body 26 can be reduced. Consequently, the manufacturing cost of the cooling member 13 can be reduced.

The first laminated sheet 28 and the second laminated sheet 29 include a metal sheet. Since metal sheets have relatively high thermal conductivity, the heat inside the sealed body 26 can be quickly transferred to the outside of the sealed body 26 and dissipated into an external space.

Moreover, according to the present embodiment, the first laminated sheet 28 and the second laminated sheet 29 that are each obtained by laminating synthetic resin films onto the surfaces of a metal sheet are employed as the sheet members.

Thus, the sealed body 26 can be formed by using a simple method of thermally fusion-bonding laminated films.

Moreover, according to the present embodiment, it is preferable that the expansion portions 39 are formed at the side edges of the sealed body 26 by the side edges of the second laminated sheet 29 being bent toward the inside of the sealed body 26, the expansion portions 30 being configured to expand so as to increase the internal volume of the sealed body 26 when the coolant 27 evaporates.

With this configuration, when the coolant 27 evaporates, and the pressure within the sealed body 26 thus increases, the expansion portions 39 deform and expand, so that the pressure within the sealed body 26 can be further reduced. Consequently, the manufacturing cost of the cooling member 13 can be further reduced.

According to the present embodiment, the absorption sheets 37, which are capable of absorbing the coolant 27, are disposed in the sealed body 26. Thus, the coolant 27 is absorbed and held in the absorption sheets 37, so that the coolant 27 can be uniformly disposed in regions where the absorption sheets 37 are respectively disposed. Consequently, unevenness in the cooling efficiency of the cooling member 13 can be suppressed.

Moreover, according to the present embodiment, the plate-shaped separators 34 are disposed in the sealed body 26, and the grooves 35 extending in the direction in which they approach that joint portion 30A, of the joint portions 30, that is joined to the heat dissipation plate 32 are formed in the separators 34.

With this configuration, the coolant 27 that has evaporated flows through the grooves 35 formed in the separators 34, thereby approaching the joint portion 30A connected to the heat dissipation plate 32. The grooves 35 according to the present embodiment extend in the up-down direction, and the vapor of the coolant 27 that has been generated at a position near the lower end portion of the sealed body 26 flows through the grooves 35, thereby moving upward to the vicinity of the joint portion 30A joined to the heat dissipation plate 32. The vapor of the coolant 27 near the joint portion 30A joined to the heat dissipation plate 32 comes into contact with the heat absorption portion 33 of the heat dissipation plate 32 and transfers heat to the heat dissipation plate 32. The heat that has been transferred to the heat dissipation plate 32 is quickly conducted from the heat absorption portion 33 to the heat dissipation portion 21, and then dissipated from the heat dissipation portion 21 to the outside of the cooling member 13. In this manner, according to the present configuration, the coolant 27 that has evaporated flows through the grooves 35 and then transfers heat to the heat dissipation plate 32 in the vicinity of the joint portion 30A joined to the heat dissipation plate 32, and thus, the heat can be quickly conducted to the heat dissipation portion 21 and then quickly dissipated to the outside of the cooling member 13.

Moreover, the power storage module 10 according to the present embodiment includes the cooling members 13, the housing 11 in which the cooling members 13 are accommodated, and the power storage elements 12 that are accommodated in the housing 11, at least a portion of an outer surface of the power storage elements 12 being in contact with the cooling members 13.

According to the present embodiment, heat that has been generated by the power storage elements 12 is absorbed by the cooling members 13 that are in contact with a portion of the outer surface of the power storage elements 12. The heat that has been absorbed by the cooling members 13 is dissipated from the heat dissipation portions 21 in the above-described manner. As a result, the power storage elements 12 can be efficiently cooled.

The above-described cooling members 13 are formed to be fluid-tight, and the coolant 27 is enclosed in the cooling members 13, which are formed to be fluid-tight. Thus, there is no necessity to configure the housing 11 of the power storage module 10 so as to be fluid-tight. As a result, the manufacturing cost of the power storage module 10 can be reduced.

Moreover, according to the present embodiment, the slits 20 are formed in the housing 11 of the battery module, and the heat dissipation portions 21 are inserted through the respective slits 20 and exposed to the outside of the housing 11. Thus, heat can be efficiently dissipated from the heat dissipation portions 21 that are exposed to the outside of the housing 11, and consequently, the heat dissipation properties of the power storage elements 12 can be improved.

Embodiment 2

Figure 16:
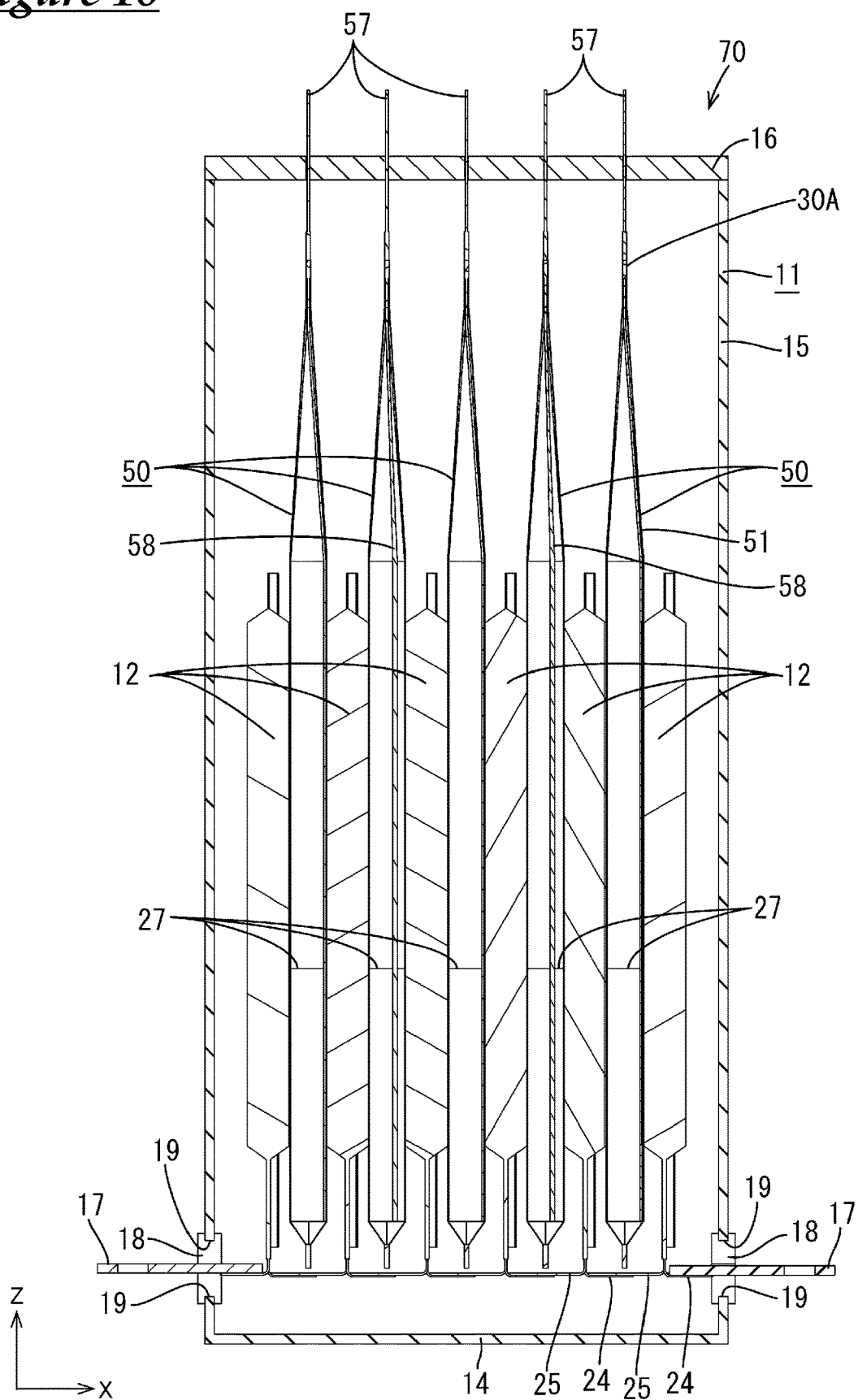
FIG. 16 is a cross-sectional view taken along line XVI-XVI in FIG. 15.
Figure 17:
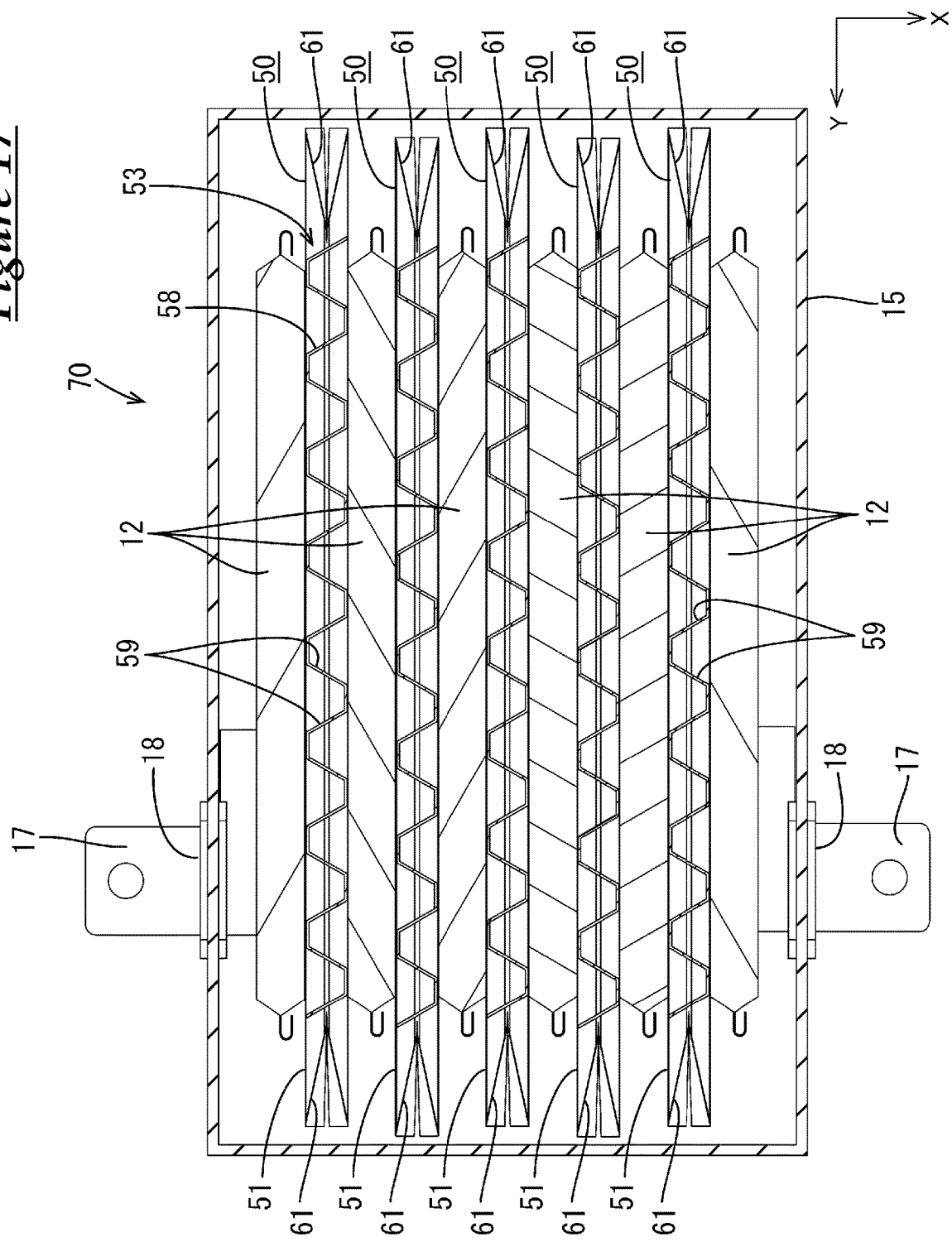
FIG. 17 is a cross-sectional view taken along line XVII-XVII in FIG. 15.

Next, Embodiment 2 will be described with reference to FIGS. 15 to 22. As shown in FIGS. 16 and 17, in a power storage module 70 according to the present embodiment, a plurality of (six in the present embodiment) power storage elements 12 are lined up in a housing 71, with a cooling member 50 being interposed between adjacent power storage elements 12. A plurality of (five in the present embodiment) cooling members 50 are accommodated in the housing 71.

Figure 18:
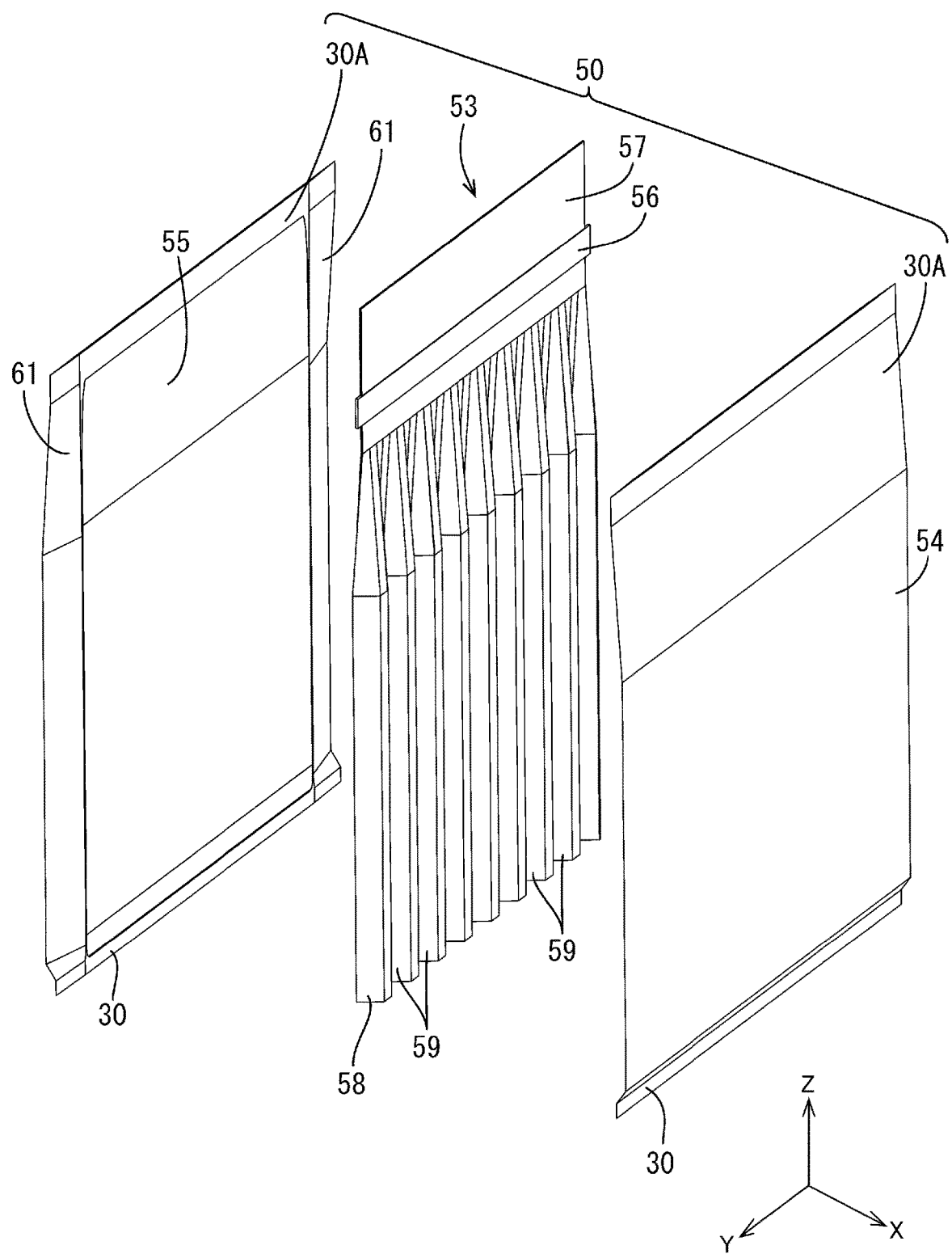
FIG. 18 is an exploded perspective view showing a cooling member.
Figure 19:
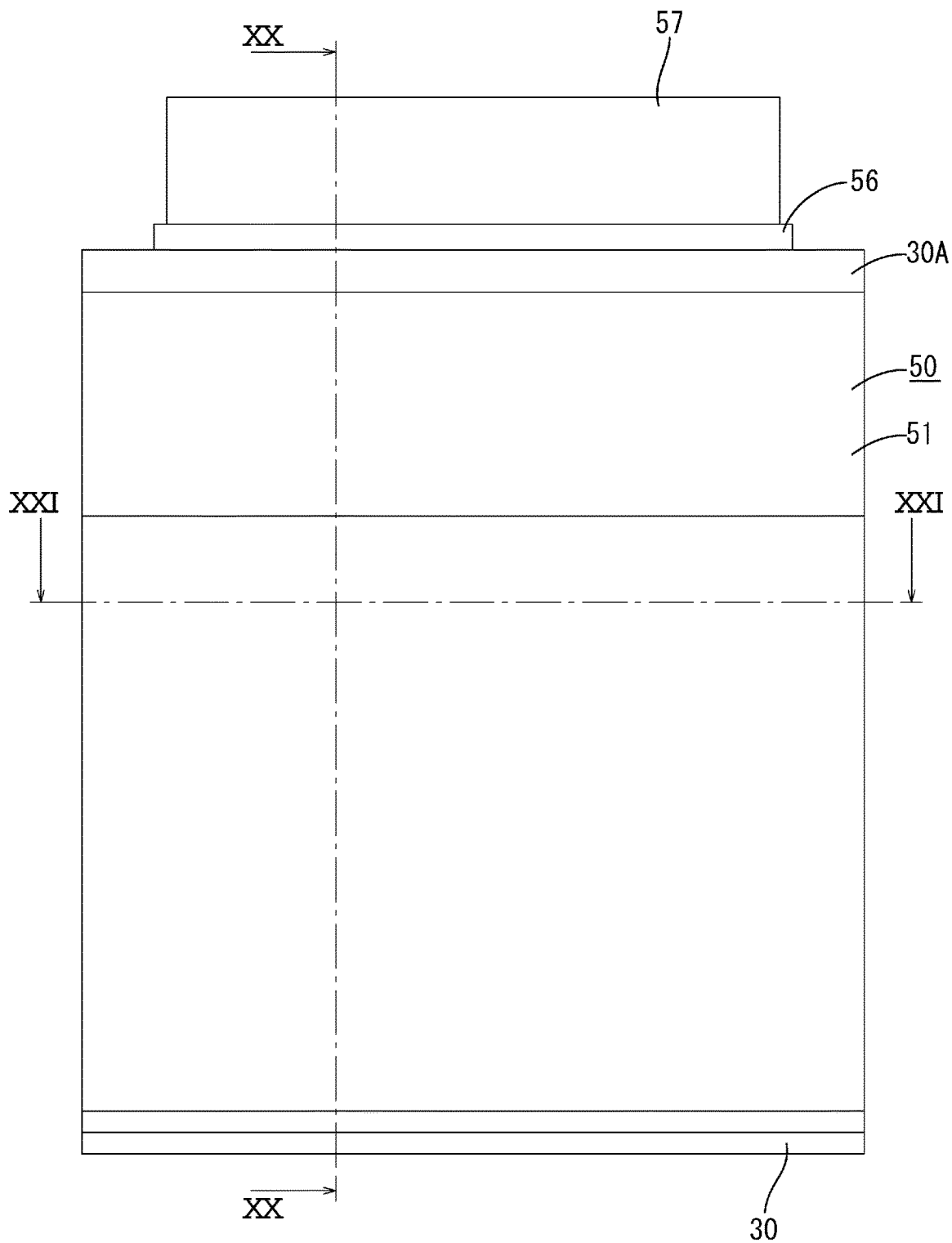
FIG. 19 is a side view showing the cooling member.

As shown in FIGS. 18 and 19, in each cooling member 50, at the joint portion 30A that is formed at an upper end edge of a sealed body 51, a heat dissipation plate 53 made of a metal is fluid-tightly joined to an inner surface of a first laminated sheet 54 and an inner surface of a second laminated sheet 55 via a sealing material 56. In the drawings, a configuration is shown in which the sealing material 56 is applied to the heat dissipation plate 53 side; however, a configuration may also be adopted in which the sealing material 56 is applied to the inner surface of the first laminated sheet 54 and the inner surface of the second laminated sheet 55.

The heat dissipation plate 53 includes a heat dissipation portion 57 that protrudes upward from the upper end edge of the sealed body 51 and that is located outside the sealed body 51, and a heat absorption portion 58 that is located inside the sealed body 51.

A plurality of grooves 59 individually extending in the up-down direction are formed in both of the left and right side surfaces of the heat absorption portion 58. Since the plurality of grooves 59 are formed in the heat absorption portion 58, when the heat absorption portion 58 is viewed in the up-down direction, the shape of the heat absorption portion 58 has depressions and protrusions.

Figure 21:
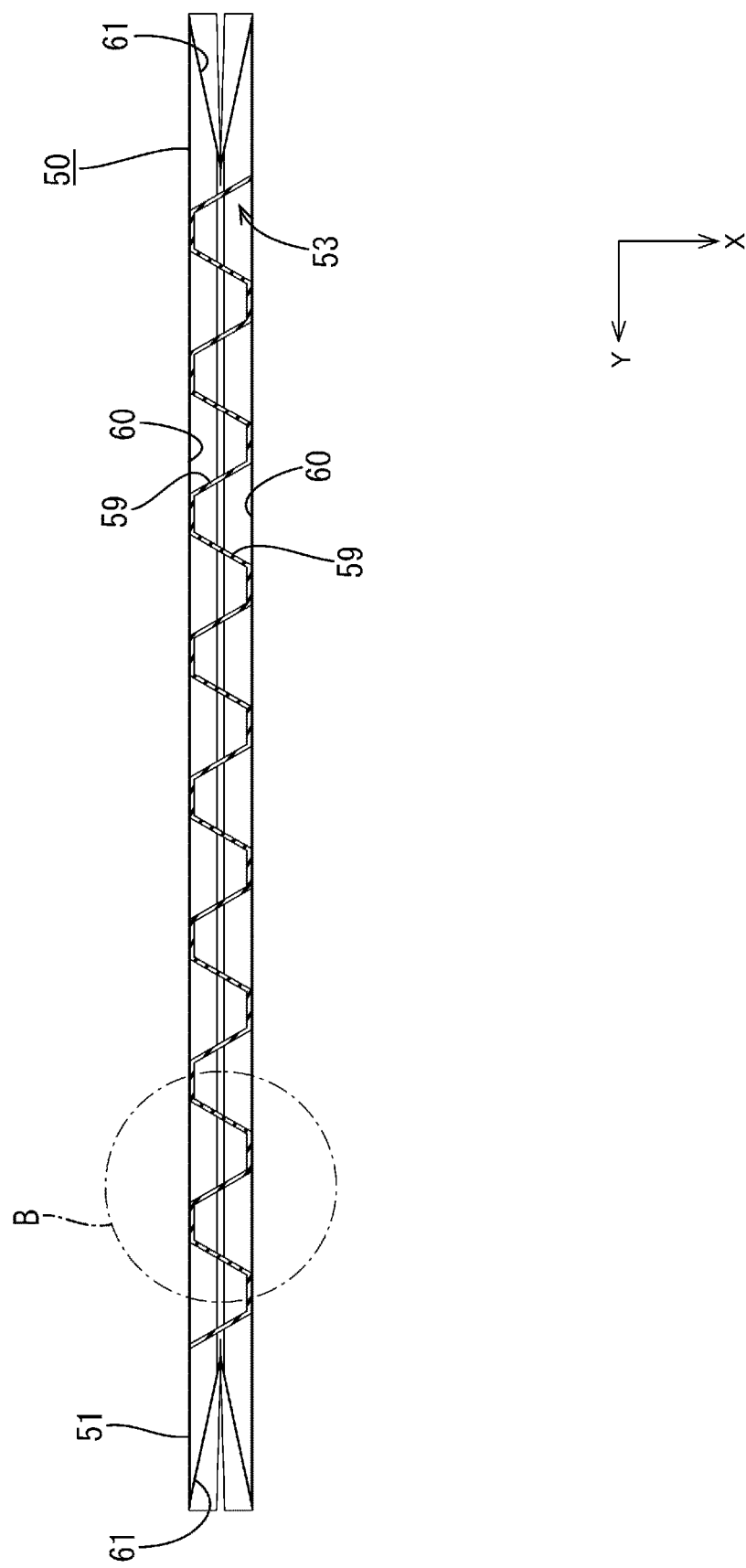
FIG. 21 is a cross-sectional view taken along line XXI-XXI in FIG. 19.

The grooves 59, which are formed in the heat absorption portion 58, are configured such that, over substantially three-fourths of the heat absorption portion 58 that begins at the lower end portion of the heat absorption portion 58 and extends upward, ridges having flat top portions are repeatedly and successively arranged as shown in FIG. 21. In substantially one-fourth of each of the grooves 59 of the heat absorption portion 58 that begins at the upper end portion of the heat absorption portion 58 and extends downward, the groove 59 is formed in a tapered shape that becomes gradually thinner upward with respect to the left-right direction. It should be noted that the width dimension of each groove 59 in the front-rear direction is constant with respect to the up-down direction.

Figure 20:
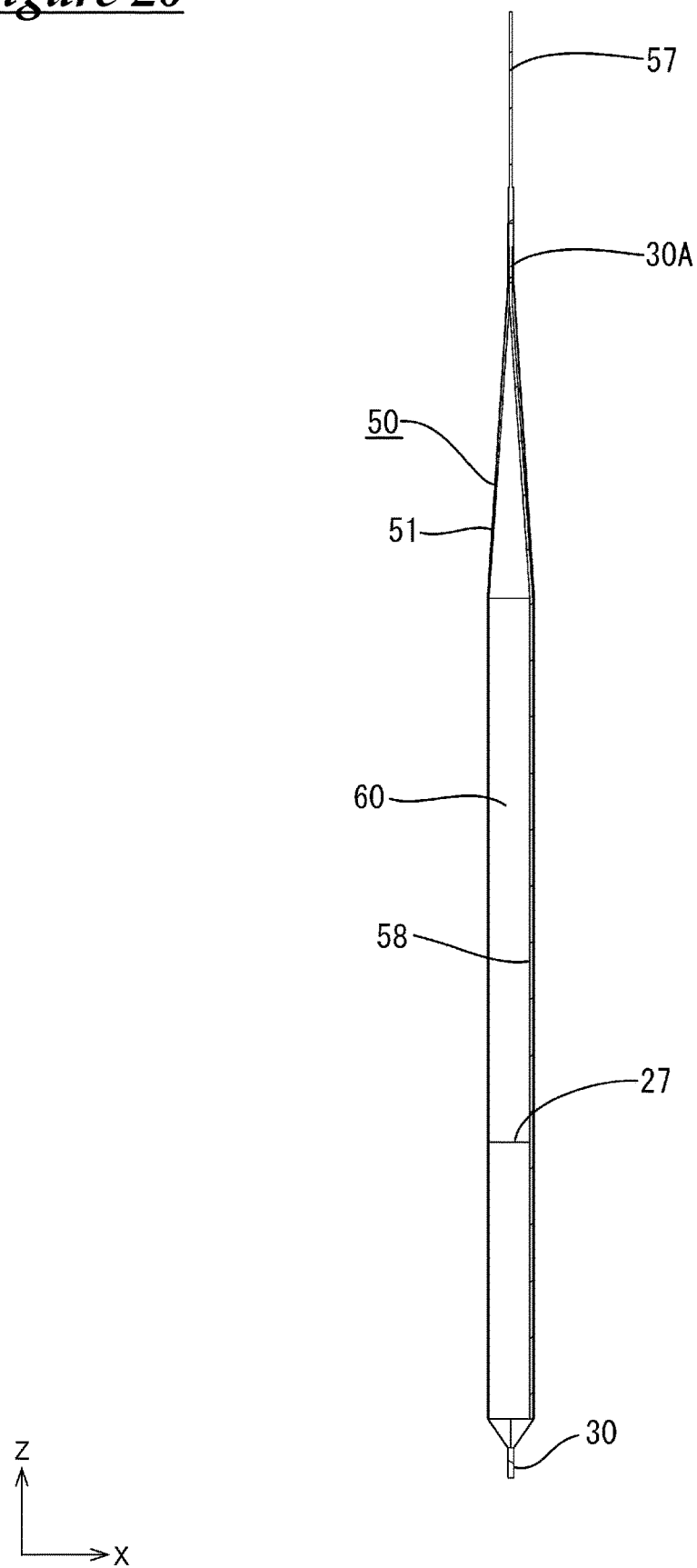
FIG. 20 is a cross-sectional view taken along line XX-XX in FIG. 19.
Figure 22:
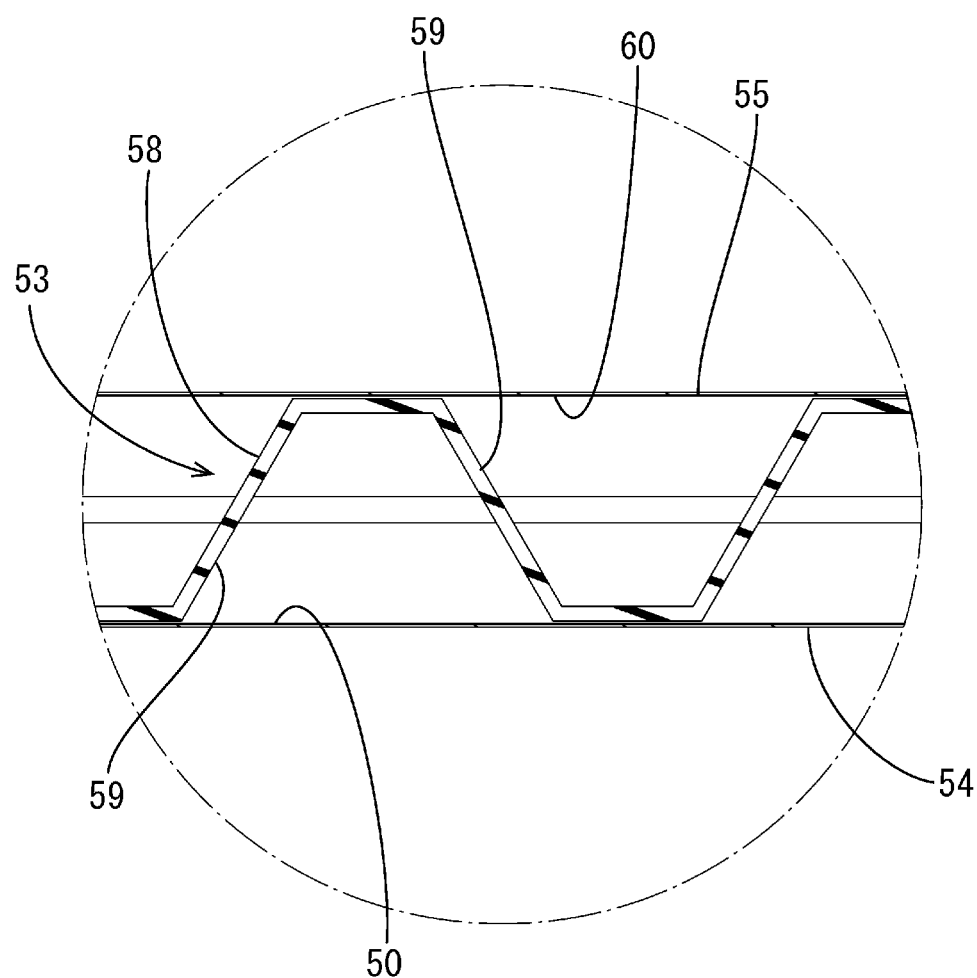
FIG. 22 is an enlarged view of a region B in FIG. 21.

As shown in FIGS. 20 to 22, spaces that are formed by the grooves 59 in the heat absorption portion 58 with the inner surface of the first laminated sheet 54 or the inner surface of the second laminated sheet 55 serve as air flow paths 60 through which the vapor of the coolant 27 that has evaporated and gasified flows upward.

The plurality of grooves 59 formed in the heat absorption portion 58 of the heat dissipation plate 53 are configured such that, when disposed in the sealed body 51, the grooves 59 individually extend in a direction in which they approach that joint portion 30A, of the joint portions 30A of the first laminated sheet 54 and the second laminated sheet 55, to which the heat dissipation plate 53 is fluid-tightly joined. In other words, if the cooling member 50 is disposed in such an orientation that, in FIG. 20, the joint portion 30A to which the heat dissipation plate 53 is fluid-tightly joined is located on the upper side, the heat dissipation plate 53 is disposed in such an orientation that, within the sealed body 51, the plate surfaces of the heat dissipation plate 53 extend along the up-down direction. In addition, the grooves 59 formed in the heat absorption portion 58 of the heat dissipation plate 53 extend along the up-down direction.

As shown in FIG. 21, in a state in which the first laminated sheet 54 and the second laminated sheet 55 are joined to each other, expansion portions 61 that are provided at both of the front and rear end portions of the second laminated sheet 55 are folded toward the inside of the sealed body 51. The expansion portions 61 are configured to deform and expand in the left-right direction when the pressure within the sealed body 51 increases as a result of the coolant 27 evaporating and gasifying. Then, the internal volume of the sealed body 51 increases, and accordingly, the internal pressure of the sealed body 51 decreases. As a result, the physical strength that is required of the sealed body 51 can be reduced.

In the present embodiment, no separators and absorption sheets are accommodated in the sealed body 51. It should be noted that a configuration may also be adopted in which an absorption sheet is accommodated in the accommodating body.

Since Embodiment 2 has substantially the same configurations as Embodiment 1 except for those described above, like members are denoted by like numerals, and redundant descriptions are omitted.

In the present embodiment, the grooves 59 individually extending in a direction in which they approaches that joint portion 30A, of the joint portions 30A, that is joined to the heat dissipation plate 53 are formed in the heat absorption portion 58 of the heat dissipation plate 53. Thus, the coolant 27 that has evaporated flows through the grooves 59, which are formed in the heat absorption portion 58 of the heat dissipation plate 53, thereby coming near the joint portion 30A connected to the heat dissipation plate 53. The grooves 59 according to the present embodiment individually extend in the up-down direction, and the vapor of the coolant 27 that has been generated at a position near the lower end portion of the sealed body 51 flows through the grooves 59, thereby moving upward to the vicinity of the joint portion 30A that is joined to the heat dissipation plate 53. The vapor of the coolant 27 near the joint portion 30A that is joined to the heat dissipation plate 53 comes into contact with the heat absorption portion 58 of the heat dissipation plate 53 and transfers heat to the heat dissipation plate 53. The heat that has been transferred to the heat dissipation plate 53 is quickly conducted from the heat absorption portion 58 to the heat dissipation portion 57 and then dissipated from the heat dissipation portion 57 to the outside of the cooling member 50. In this manner, according to the present configuration, since the coolant 27 that has evaporated flows through the grooves 59 and then transfers heat to the heat dissipation plate 53 in the vicinity of the joint portion 30A joined to the heat dissipation plate 53, the heat can be quickly conducted to the heat dissipation portion 57, and then the heat can be quickly dissipated to the outside of the cooling member 50.

Other Embodiments

The present invention is not limited to the embodiments that have been described above with reference to the drawings, and embodiments such as those described below, for example, are also included in the technical scope of the present invention.

In the foregoing embodiment, a configuration in which a plurality of grooves 35 are formed in each separator 34 has been described. However, the present invention is not limited to this configuration, and the number of grooves 35 formed in each separator 34 may also be one.

In the foregoing embodiment, a configuration in which a plurality of grooves 59 are formed in the heat dissipation plate 53 has been described. However, the present invention is not limited to this configuration, and the number of grooves 59 formed in the heat dissipation plate 53 may also be one.

In the foregoing embodiment, five slits 20 are formed in the housing 11; however, the present invention is not limited to this configuration, and the number of slits 20 may also be two to four or may also be six or more.

The cooling members according to the foregoing embodiments are used for the power storage modules; however, the present invention is not limited to this configuration, and the cooling members can be used for any heat-generating components, such as an electrical junction box and an ECU, as appropriate.

In the foregoing embodiments, the laminated sheets are used as the sheet members; however, the present invention is not limited to this configuration, and sheet members formed of, for example, a metal foil such as an aluminum foil or a copper foil may also be used. In this case, when joining the sheet members to each other, the sheet members can be fluid-tightly connected to each other through adhesion, welding, brazing, soldering, or the like. Moreover, sheet members in each of which a synthetic resin film is laminated on one surface of a metal foil may also be used. In this case, the sheet members can be fluid-tightly joined to each other by bringing the synthetic resin films into contact with each other and thermally fusion-bonding the synthetic resin films.

Moreover, sheet members composed of a synthetic resin, such as polyolefin such as polyethylene or polypropylene, polyester such as polyethylene terephthalate or polybutylene terephthalate, or polyamide such as nylon 6,6, may also be used.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

LIST OF REFERENCE NUMERALS

10 Power storage module
11 Housing
13, 50 Cooling member
20 Slit
21, 57 Heat dissipation portion
22 Power storage element
26, 51 Sealed body
27 Coolant
28, 54 First laminated sheet
29, 55 Second laminated sheet
30, 30A Joint portion
32, 53 Heat dissipation plate
33, 58 Heat absorption portion
34 Separator
35, 59 Groove
37 Absorption sheet
39, 61 Expansion portion

The invention claimed is:
1. A cooling member comprising:
a fluid-tight sealed body that is formed by sheet members being joined to each other at at least one joint portion;
a coolant that is enclosed in the sealed body; and
a heat dissipation plate that is fluid-tightly joined to an inner surface of a first one of the sheet members and an inner surface of a second one of the sheet members of the sealed body at a first one of the at least one joint portion and that has a heat absorption portion that is located inside the sealed body and a heat dissipation portion that is located outside the sealed body, wherein the heat dissipation plate is joined to the first sheet member at the first joint portion on a first face of the heat dissipation plate and joined to the second sheet member at the first joint portion on a second face of the heat dissipation plate that opposes the first face of the heat dissipation plate, wherein the heat dissipation plate is a single metal plate that extends from the heat absorption portion located within the sealed body to the heat dissipation portion located outside the sealed body, wherein the heat dissipation plate includes a first end and a second end opposed from the first end, and wherein the first end is provided at the heat absorption portion and is located within the sealed body.

2. The cooling member according to claim 1, wherein the sheet members include a metal sheet.

3. The cooling member according to claim 2, wherein the sheet members are each a laminated film in which a synthetic resin film is laminated on a surface of the metal sheet.

4. The cooling member according to claim 1, wherein an absorption sheet that absorbs the coolant is disposed in the sealed body.

5. The cooling member according to claim 1, wherein a plate-shaped separator is disposed in the sealed body, and
grooves are formed in the separator, the grooves extending in a direction in which the grooves approach the first joint portion, of the at least one joint portion, that is joined to the heat dissipation plate.

6. The cooling member according to claim 1, wherein grooves are formed in the heat absorption portion of the heat dissipation plate, the grooves extending in a direction in which the grooves approach the first joint portion, of the at least one joint portion, that is joined to the heat dissipation plate.

7. A power storage module comprising:
the cooling member according to claim 1;
a housing in which the cooling member is accommodated; and
a power storage element that is accommodated in the housing, at least a portion of an outer surface of the power storage element being in contact with the cooling member.

8. The power storage module according to claim 7, wherein a slit is formed in the housing, and
the heat dissipation portion is inserted through the slit and exposed to the outside of the housing.

9. A cooling member comprising:
a fluid-tight sealed body that is formed by sheet members being joined to each other at at least one joint portion;
a coolant that is enclosed in the sealed body; and
a heat dissipation plate that is fluid-tightly joined to an inner surface of a first one of the sheet members and an inner surface of a second one of the sheet members of the sealed body at a first one of the at least one joint portion and that has a heat absorption portion that is located inside the sealed body and a heat dissipation portion that is located outside the sealed body, wherein the heat dissipation plate is joined to the first sheet member at the first joint portion on a first face of the heat dissipation plate and joined to the second sheet member at the first joint portion on a second face of the heat dissipation plate that opposes the first face of the heat dissipation plate, and wherein the heat dissipation plate is a single metal plate that extends from the heat absorption portion located within the sealed body to the heat dissipation portion located outside the sealed body, wherein an expansion portion is formed at a side edge of the sealed body by a side edge of at least one of the sheet members being bent toward the inside of the sealed body, the expansion portion being configured to expand so as to increase an internal volume of the sealed body when the coolant evaporates.

* * * * *